United States Patent
Parsey, Jr. et al.

(10) Patent No.: US 9,117,802 B2
(45) Date of Patent: Aug. 25, 2015

(54) ELECTRONIC DEVICE INCLUDING A FEATURE IN AN OPENING

(71) Applicant: SEMICONDUCTOR COMPONENTS INDUSTRIES, LLC, Phoenix, AZ (US)

(72) Inventors: John Michael Parsey, Jr., Phoenix, AZ (US); Gordon M. Grivna, Mesa, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 16 days.

(21) Appl. No.: 13/920,675

(22) Filed: Jun. 18, 2013

(65) Prior Publication Data

US 2013/0277807 A1  Oct. 24, 2013

Related U.S. Application Data

(62) Division of application No. 12/871,390, filed on Aug. 30, 2010, now Pat. No. 8,492,260.

(51) Int. Cl.
*H01L 29/40* (2006.01)
*H01L 23/48* (2006.01)
(Continued)

(52) U.S. Cl.
CPC ........ *H01L 23/481* (2013.01); *H01L 21/76898* (2013.01); *H01L 27/0207* (2013.01);
(Continued)

(58) Field of Classification Search
CPC ... H01L 23/481; H01L 21/7698; H01L 28/10; H01L 28/20; H01L 28/91; H01L 27/0207; H01L 2224/0525; H01L 2224/05; H01L 2224/0401; H01L 29/66106; H01L 29/861; H01L 29/866; H01L 29/945; H01L 29/6609

USPC .......... 257/621, E21.586, E21.602; 438/329, 438/361, 427, 598
See application file for complete search history.

(56) References Cited

U.S. PATENT DOCUMENTS 4,745,081 A * 5/1988 Beyer et al. .................. 438/429
5,501,893 A   3/1996 Laermer et al.
(Continued)

FOREIGN PATENT DOCUMENTS

DE   102005039068 A1   2/2007
JP      2002043502 A    2/2002
(Continued)

OTHER PUBLICATIONS

European Search Report from EP11169049.1 dated Jan. 17, 2014, 2 pgs.
(Continued)

*Primary Examiner* — Colleen A Matthews
*Assistant Examiner* — Colleen E Snow
(74) *Attorney, Agent, or Firm* — Abel Law Group, LLP

(57) ABSTRACT

A semiconductor substrate can be patterned to define a trench and a feature. In an embodiment, the trench can be formed such that after filling the trench with a material, a bottom portion of the filled trench may be exposed during a substrate thinning operation. In another embodiment, the trench can be filled with a thermal oxide. The feature can have a shape that reduces the likelihood that a distance between the feature and a wall of the trench will be changed during subsequent processing. A structure can be at least partly formed within the trench, wherein the structure can have a relatively large area by taking advantage of the depth of the trench. The structure can be useful for making electronic components, such as passive components and through-substrate vias. The process sequence to define the trenches and form the structures can be tailored for many different process flows.

19 Claims, 14 Drawing Sheets

(51) Int. Cl.
  *H01L 21/768* (2006.01)
  *H01L 27/02* (2006.01)
  *H01L 49/02* (2006.01)
  *H01L 29/66* (2006.01)
  *H01L 29/861* (2006.01)
  *H01L 29/866* (2006.01)
  *H01L 29/94* (2006.01)

(52) U.S. Cl.
  CPC .............. *H01L28/10* (2013.01); *H01L 28/20* (2013.01); *H01L 28/91* (2013.01); *H01L 29/6609* (2013.01); *H01L 29/66106* (2013.01); *H01L 29/861* (2013.01); *H01L 29/866* (2013.01); *H01L 29/945* (2013.01); *H01L 2224/0401* (2013.01); *H01L 2224/05* (2013.01); *H01L 2224/05025* (2013.01); *H01L 2924/1301* (2013.01); *H01L 2924/1305* (2013.01)

(56) References Cited

U.S. PATENT DOCUMENTS

| | | |
|---|---|---|
| 6,621,136 B2 | 9/2003 | Grivna |
| 6,818,525 B1 | 11/2004 | Durham et al. |
| 6,841,883 B1 | 1/2005 | Farnworth et al. |
| 6,984,860 B2 | 1/2006 | Grivna et al. |
| 7,087,925 B2 | 8/2006 | Grivna |
| 7,315,223 B2 | 1/2008 | Margomenos |
| 7,326,629 B2 | 2/2008 | Nagarajan et al. |
| 7,344,959 B1 | 3/2008 | Pogge et al. |
| 7,388,277 B2 | 6/2008 | Pogge et al. |
| 7,411,266 B2 | 8/2008 | Tu et al. |
| 7,452,796 B2 | 11/2008 | Davies |
| 7,485,965 B2 | 2/2009 | Lanzerotti et al. |
| 7,485,968 B2 | 2/2009 | Enquist et al. |
| 7,510,907 B2 | 3/2009 | Heck et al. |
| 7,560,802 B2 | 7/2009 | Kalvesten et al. |
| 7,589,009 B1 | 9/2009 | Roy et al. |
| 7,589,390 B2 | 9/2009 | Yao |
| 7,608,534 B2 | 10/2009 | Yun et al. |
| 7,611,931 B2 | 11/2009 | Cheng et al. |
| 7,615,462 B2 | 11/2009 | Kim et al. |
| 7,626,269 B2 | 12/2009 | Oliver et al. |
| 7,645,701 B2 | 1/2010 | Anderson et al. |
| 7,670,927 B2 | 3/2010 | Bernstein et al. |
| 7,675,162 B2 | 3/2010 | Foster et al. |
| 7,679,146 B2 | 3/2010 | Tu et al. |
| 7,687,916 B2 | 3/2010 | Lake |
| 7,727,887 B2 | 6/2010 | Christensen et al. |
| 7,741,722 B2 | 6/2010 | Andry et al. |
| 7,803,714 B2 | 9/2010 | Ramiah et al. |
| 7,998,852 B2 | 8/2011 | Jones et al. |
| 8,292,690 B2 | 10/2012 | Seddon |
| 8,357,944 B2 | 1/2013 | Drabe et al. |
| 8,492,260 B2 | 7/2013 | Parsey, Jr. et al. |
| 2003/0113981 A1 | 6/2003 | Combi et al. |
| 2004/0212099 A1 | 10/2004 | Klein et al. |
| 2006/0097357 A1 | 5/2006 | Nemoto |
| 2007/0134819 A1 | 6/2007 | Uchiyama |
| 2008/0105976 A1 | 5/2008 | Pogge et al. |
| 2008/0272499 A1 | 11/2008 | DeNatale et al. |
| 2008/0291601 A1 | 11/2008 | Roozeboom et al. |
| 2009/0001600 A1 | 1/2009 | Somani |
| 2009/0170272 A1 | 7/2009 | Nakamura |
| 2009/0294983 A1 | 12/2009 | Cobbley et al. |
| 2009/0311828 A1 | 12/2009 | Andry et al. |
| 2009/0315188 A1 | 12/2009 | Anderson et al. |
| 2012/0049320 A1 | 3/2012 | Parsey, Jr. et al. |
| 2014/0070375 A1 | 3/2014 | Grivna |

FOREIGN PATENT DOCUMENTS

| | | |
|---|---|---|
| WO | 2004084300 A1 | 9/2004 |
| WO | 2007054870 A1 | 5/2007 |

OTHER PUBLICATIONS

Bauer, Thomas, "High Density Through Wafer Via Technology"; Technical Proceedings of the 2007 Nanotechnology Conference & Trade Show, vol. 3; May 20-24, 2007; pp. 116-119; Santa Clara, CA.

Chow, Eugene M. et al.; "Process Compatible Polysilicon-Based Electrical Through-Wafer Interconnects in Silicon Substrates"; Journal of Microelectromechanical Systems; vol. 11, Issue 6.; Dec. 2002; pp. 631-640; IEEE ISSN 1057-7157.

Igic, Petar et al.; "Technology for Power Integrated Circuits with Multiple Vertical Power Devices"; 18th International Symposium on Power Semiconductor Devices & IC's; Jun. 4-8, 2006; Naples, Italy; 4 pages.

Klootwijk, J.H. et al.; "Ultrahigh Capacitance Density for Multiple ALD-Grown MIM Capacitor Stacks in 3-D Silicon"; IEEE Electron Device Letters; Jul. 2008; vol. 29, Issue 7; pp. 740-742; IEEE ISSN 0741-3106.

Savastiouk, Sergey; "Through Silicon Vias (TSV): Design and Reliability"; IEEE Santa Clara Valley Chapter, Components, Packaging, Manufacturing Technology; May 13, 2009; 15 pages.

Vardaman, E. Jan, "3D Packaging and the Future of TSV", Presentation at SEMICON West 2008, 11 pages, TechSearch International, Inc. San Francisco, CA.

* cited by examiner

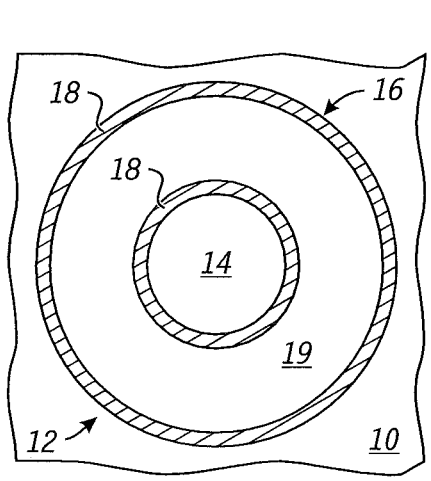
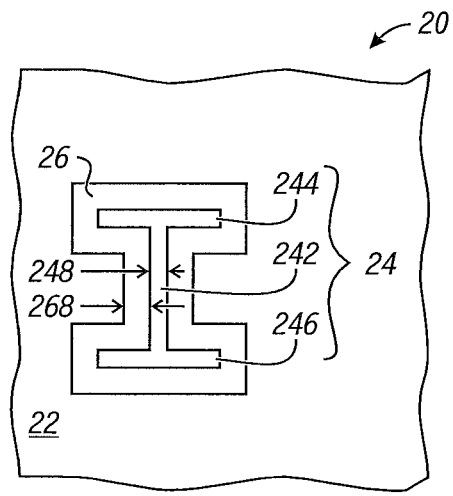
FIG. 1
(PRIOR ART)
FIG. 2
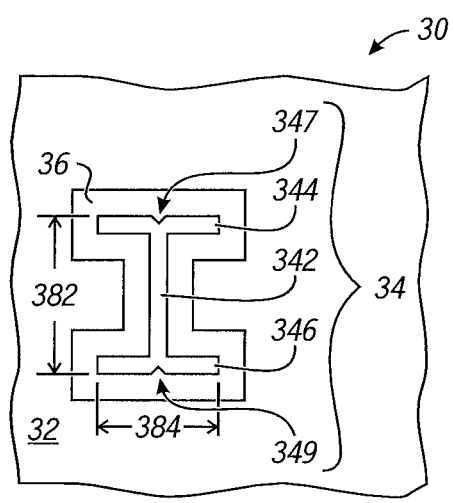
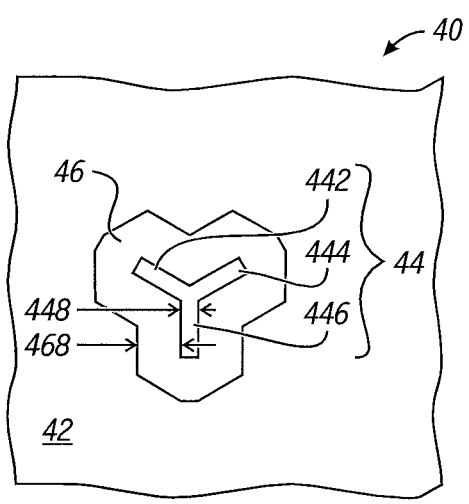
FIG. 3
FIG. 4

ELECTRONIC DEVICE INCLUDING A FEATURE IN AN OPENING

RELATED APPLICATION

This application is a divisional of and claims priority under 35 U.S.C. §120 to U.S. patent application Ser. No. 12/871,390 entitled "Electronic Device Including a Feature in a Trench" by Parsey et al. filed Aug. 30, 2010, which is assigned to the current assignee hereof and incorporated herein by reference in its entirety.

FIELD OF THE DISCLOSURE

The present disclosure relates to electronic devices and processes of forming electronic devices, and more particularly to electronic devices including features within trenches and processes of forming the same.

RELATED ART

Through-wafer vias are typically used to form connections between different die in a stacked configuration. Such vias can be formed by forming circuitry at one of the major surfaces of a wafer. The wafer is then thinned by backgrinding or other mechanical operation, and then vias are formed though all or substantially all of the remaining thickness of the wafer. Each via has a width that is similar to but slightly smaller than the area occupied by a bond pad. As such, the widths of the vias are 50 microns or larger. The vias consist of bulk silicon, polysilicon, an elemental metal, a metal alloy, a conductive metal nitride, or a combination thereof and do not include a discrete internal feature. In other words, the vias are simple miniature wires. The wafer is singulated to form individual die, and the die can then be stacked such that bond pads of one die are electrically connected to bond pads of another die within the stack because of the vias. The stacked die are attached to a packaging substrate, and the combination of packaging substrate and stacked die are assembled into a completed integrated circuit.

FIG. 1 includes an illustration of top view of a structure 12 used in a prior art electronic device. The structure 12 is used for making electrical connections with the through-wafer vias in applications such as imaging sensors and microscale packaging applications. The structure 12 is formed by etching a die substrate 10 to form a conductive center feature 14 and an annular trench 16 that surrounds the center feature 14. The die substrate 12 and the center feature 14 have substantially the same composition and crystal orientation. The center feature has a typical width of 100 microns, and the trench has a width of 15 microns and a depth of up to several hundred microns. A thermal oxidization is performed to form a liner oxide 18 along the expose sidewalls of the center feature 14 and the annular trench 16. A remaining portion of the annular trench 16 is filled with a dielectric material 19.

BRIEF DESCRIPTION OF THE DRAWINGS

Embodiments are illustrated by way of example and are not limited in the accompanying figures.

FIG. 1 includes a top view of a structure used in a prior art electronic device. (Prior Art).

FIG. 2 includes a top view of a particular feature within a trench in accordance the concepts as described herein.

FIG. 3 includes a top view of another particular feature within another trench in accordance the concepts as described herein.

FIG. 4 includes a top view of another particular feature within another trench in accordance the concepts as described herein.

Figure 5:
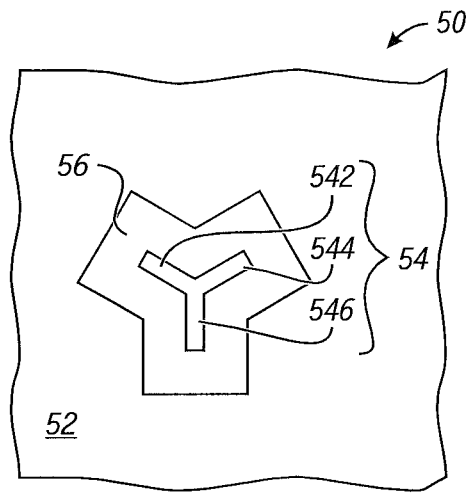
FIG. 5 includes a top view of another particular feature within another trench in accordance the concepts as described herein.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application. While numerical ranges are described herein to provide a better understanding of particular embodiments, after reading this specification, skilled artisans will appreciate that values outside the numerical ranges may be used without departing from the scope of the present invention.

The term "active component" is intended to mean to an electronic component that includes a control electrode, which when properly biased turns on or turns off the electronic component, such that electrical current between current electrodes of the electronic component flows or does not flow. An example of an active component includes a bipolar transistor, a field-effect transistor, a semiconductor-controlled rectifier, a thyristor, or the like.

The term "electrode component" is intended to mean to a component that is or can readily be made part of a circuit. An example of an electronic component includes an active component, a passive component, an interconnect, a via, or the like.

The term "metal" or any of its variants when referring to a material is intended to mean to a material, whether or not a molecular compound, that includes an element that is within any of the Groups 1 to 12, within Groups 13 to 16, an element that is along and below a line defined by atomic numbers 13 (Al), 31 (Ga), 50 (Sn), 51 (Sb), and 84 (Po). Metal does not include Si or Ge, by itself. Group numbers corresponding to columns within the Periodic Table of the elements use the "New Notation" convention as seen in the *CRC Handbook of Chemistry and Physics,* 81$^{st}$ Edition (2000-2001).

The term "passive component" is intended to mean to an electronic component that significantly affects a voltage or a current when part of an electronic circuit, wherein such electronic component does not have a control electrode. An example of a passive component includes a capacitor, a diode, an inductor, a resistor, or the like. For the purposes of this specification, interconnects and vias are not passive components.

The term "substantially fills" when referring to a material being formed within an opening or a trench, is intended to mean that most of the opening or trench, or most of a remainder of the opening or trench (if a liner, barrier, or other relatively-thin layer has been previously formed) is filled by the material. Note that an incidental void may be formed when substantially filling the opening or trench with the material. The term "substantially completely fills" is intended to mean that substantially all of the opening or trench or substantially all of the remainder of the opening or trench is filled with the material without a significant number of voids formed within the opening or trench.

The terms "comprises," "comprising," "includes," "including," "has," "having," or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read such that the plurals include one or at least one and the singular also includes the plural, unless it is clear that it is meant otherwise. For example, when a single item is described herein, more than one item may be used in place of a single item. Similarly, where more than one item is described herein, a single item may be substituted for that more than one item.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

Finely shaped features can be formed within deep trenches wherein the features substantially maintain their shape even when processed where trenches surrounding the features are filled with a material. In an embodiment, the feature can have a shape from a top view that includes a segment that significantly increases the mechanical stability of the feature. In another embodiment, the feature can have a shape from a top view that is an annulus. Both types of features can have significantly increased mechanical stability and can allow a trench to be formed to a depth of at least approximately 40 microns or deeper and be substantially filled with a material while the feature maintains substantially the same spacing from sidewalls of a substrate, and if present, other immediately adjacent features. Embodiments described herein can achieve relatively large dimensions while only occupying a relatively small amount of die substrate area. In the description below, different shapes of features and trenches that form basic building blocks will be described. Clearly, many other shapes may be used without departing from the scope of the appended claims.

FIG. 2 includes an illustration of a top view of a portion of a workpiece 20 that includes a die substrate 22, a feature 24 having a shape of an I-beam, and a trench 26 between the die substrate 22 and the feature 24. The feature 24 includes segments 242, 244, and 246. Segments 244 and 246 help to increase the mechanical stability of the feature 24 as compared to another feature that would only have segment 242. The lengths of the segments 242, 244, and 246 lie along different lines, wherein the lines corresponding to the lengths of segments 244 and 246 are substantially parallel to each other. In another embodiment (not illustrated), the lengths of segments 244 and 246 are not parallel to one another.

The segment 242 has a segment width ("S") 248. S can be at least as large as the resolution limit of a lithography tool used to pattern the workpiece 20 to form the feature 24. In an embodiment, S is at least approximately 0.6 microns, and in another embodiment, S is at least approximately 0.8 microns. In theory, there is no known upper limit on the value for S; however, as S increases, the amount of die substrate area occupied by the feature 24 along a major surface becomes larger. S may be up to 5 microns, as at greater than five microns, another simpler shape, such as a solid circle (see FIG. 1) or other solid planar shape can be used. Because embodiments described herein can be used to decrease the size of the features while still maintaining acceptable mechanical stability, S can be less than 2.0 microns. In an embodiment, S is no greater than approximately 1.6 microns, and in another embodiment, S is no greater than approximately 1.4 microns. In a particular embodiment, S is in a range of approximately 0.8 to approximately 1.2 microns. The segments 244 and 246 can have the same width or different widths as compared to the segment 242.

The trench 26 has a trench width ("T") 268. T can be at least as large as the resolution limit of a lithography tool used to pattern the workpiece 20 to define the trench 26. Note that the width of the trench 26 can vary as a function of depth, as the trench 26 may be narrower near the bottom of the trench 26 as compared to the top of the trench 26. Thus, T is measured in the trench 26 at an elevation closest to the major surface of the die substrate 22 from which active components are formed. Similar to S, there is no known upper limit on the value for T; however, as T increases, the amount of die substrate area occupied by the trench 26 along a major surface becomes larger. Further, a relatively wide trench takes a longer deposition and more material to fill. The trenches may or may not be tapered from top to bottom, or bottom to top, or flared in some manner that is advantageous to the device configuration or device performance or improves fabrication. Thus, T may be up to 10 microns from a practical standpoint. In an embodiment, T is no greater than approximately 10 microns, and in another embodiment, T is no greater than approximately 4.0 microns. In a particular embodiment, T is in a range of approximately 0.8 microns to approximately 3.0 microns. Distances between each of the sides of the feature 24 and its closest corresponding side of the trench 26 can be any of the dimensions as described with respect to the dimension T. The distances may be the substantially the same or different along different sides of the feature 24. In the embodiment illustrated in FIG. 2, the trench 26 has substantially the same width at all locations along the major surface of the die substrate 22.

FIG. 3 includes an illustration of a top view of a portion of a workpiece 30 that includes a die substrate 32, a feature 34 having a shape of an I-beam, and a trench 36 between the die substrate 32 and the feature 34. Similar to the feature 24, the feature 34 includes segments 342, 344, and 346. The feature 34 can be useful in forming an isolation structure within the trench 36. Unlike the feature 24, the feature 34 has notches 347 and 349 at opposite ends of the feature 34. From a top view, the notches 347 and 349 help to keep the distances between sides of the feature 34 more uniform at substantially all points along the perimeter of the feature 34. Thus, the feature 34 to be thermally oxidized such that complete oxidation along all sides of the feature 34 at any particular elevation occurs substantially simultaneously. Compare the feature 34 to the feature 24; during thermal oxidation of the feature 24 and at the same elevation, parts of the feature 24 corresponding to the intersection of segments 242 and 244 and the intersection of segments 242 and 246 may not be completely oxidized when the remainder of the feature 24 is oxidized. Thus, the feature 34 is less likely to leave residual spikes or needles of die substrate material within an isolation structure. Therefore, the feature 34 can be useful in forming a very deep isolation structure, and in a particular embodiment, may extend substantially completely through the die substrate 32 after a portion of the die substrate 32 has been removed. The configuration also enhances the strength and stability of the via structure. The values for S and T as previously described for feature 24 may be used for the widths of the segments 342, 344, and 346 of the feature 34, and the width of the trench 36.

T may be expressed as a relation to S. Such a relationship can be useful when forming an isolation structure in which the trench 36 is filled with a thermal oxide, wherein the thermal oxidation consumes substantially all of the feature 34 to a depth of tens of microns into the trench 36. In an embodiment, T is at least approximately 0.9 times S, and in another embodiment, T is no greater approximately 5.0 times S. In a particular embodiment, T is in a range of approximately 1.0 to approximately 4.0 times S, and in another particular embodiment, T can be in a range of approximately 1.3 to approximately 3.0 times S. For example, when S is 0.8 microns, T can be in a range of approximately 1.2 microns to approximately 2.0 microns; when S is 1.0 microns, T can be in a range of approximately 1.4 microns to approximately 2.4 microns; and when S is 1.2 microns, T can be in a range of approximately 1.6 microns to approximately 2.8 microns. Such ranges are merely exemplary and are not intended to limit the range of values for T given a particular value of S.

In a non-limiting embodiment, the feature 34 has an overall length ("L") 382 and an overall width ("W") as measured at an elevation closest to the major surface of the die substrate 32. L can be determined as a function of S and T as previously described. In a particular embodiment, L is within 20% of the sum of 4 times S and 3 times T or (4S+3T), when expressed as a formula. In another particular embodiment, L is within 10% of (4S+3T), and in a further particular embodiment, L is within 5% of (4S+3T). W can be expressed as a function of L. In an embodiment, W is at least 0.4 L, and in another embodiment W is at least 0.6 L. In a particular embodiment, W is in a range of approximately 0.45 L to approximately 0.55 L.

While the relationships between S and T have been described with respect to the feature 34 and trench 36, any one or more of such relationships can be extended to the widths of segments of other features and widths of other trenches described herein, including feature 24 and trench 26. Similarly, the relationships between L and W with respect to each other and S and T may also be used for the feature 24 and the trench 26.

FIGS. 4 and 5 illustrate Y-shaped features and corresponding trenches. FIG. 4 includes an illustration of a top view of a portion of a workpiece 40 that includes a die substrate 42, a feature 44 having a Y-shape, and a trench 46 between the die substrate 42 and the feature 44. The feature 44 includes segments 442, 444, and 446 each extending in a different directions from the center of the feature 44. The segment 442 has a segment width 448 that can have any value as previously described for dimension S with respect to the feature 24 in FIG. 2. The segments 444 and 446 also have segment widths that can have any value as previously described for dimension S with respect to the feature 24 in FIG. 2. As between the segments 442, 444, and 446, they can have substantially the same or different segment widths as compared to each other.

The lengths of the segments 442, 444, and 446 have no theoretically known upper limits; however practical concerns, such as the available area of the die substrate 42 can provide a practical upper limit. In an embodiment, the lengths of the segments 442, 444, and 446 are no greater than 50 microns, and in another embodiment, the lengths are no greater than 9 microns. In a further embodiment, the lengths of the segments are at least as long as the narrowest width for the segments 442, 444, and 446, and in still a further embodiment, the length of each segment is at least 2 times the width of the same segment. In a particular embodiment, the lengths of the segments 442, 444, and 446 are in a range of approximately 1.2 microns to approximately 4.0 microns. The trench structure may be oriented along selected crystal planes of the substrate to control the oxidation or deposition of the various layers comprising the via structure, for example, aligning segments along {100} or {110} or {111} directions (or other directions in other substrate materials).

The trench 46 is shaped so that the distance between any point along the side of the trench 46 to a corresponding closest point of the feature 44 is more uniform as compared to the feature 54 and trench 56 in FIG. 5. The trench 46 has a trench width 468 that can have any value as previously described for dimension T with respect to the trench 26 in FIG. 2 or the relationships between T and S as described with respect to the feature 34 and the trench 36 in FIG. 3.

FIG. 5 includes an illustration of a top view of a portion of a workpiece 50 that includes a die substrate 52, a feature 54 having a Y-shape, and a trench 56 between the die substrate 52 and the feature 54. The feature 54 can have any of the attributes as described with respect to the feature 44 of FIG. 4. In FIG. 5, the trench 56 differs from the trench 46 in that sides of the trench 56 closest to the ends of segments 542, 544, and 546 are more squared as compared to corresponding regions of the trench 46 in FIG. 4. From a physical design standpoint, the trench 56 of FIG. 5 may allow simpler calculations to be made when a computer is used to determine the placement of the trench 56 within an integrated circuit design. Other than the shapes of the corners of the trench 56, the trench can have any of the attributes as described with respect to the trench 46 of FIG. 4. After reading this specification, skilled artisans will be able to determine whether the trench 46 of FIG. 4 or the trench 56 of FIG. 5 provides a better choice for their particular application.

Figure 6:
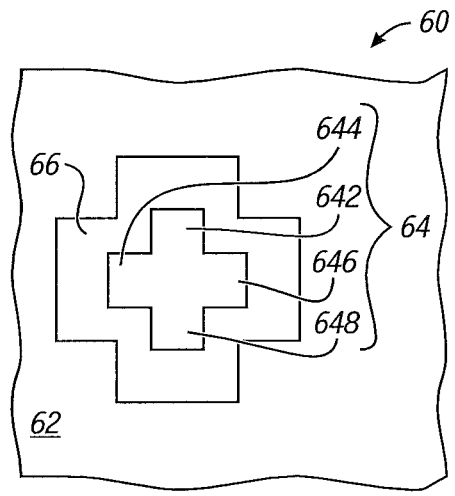
FIG. 6 includes a top view of another particular feature within another trench in accordance the concepts as described herein.
Figure 7:
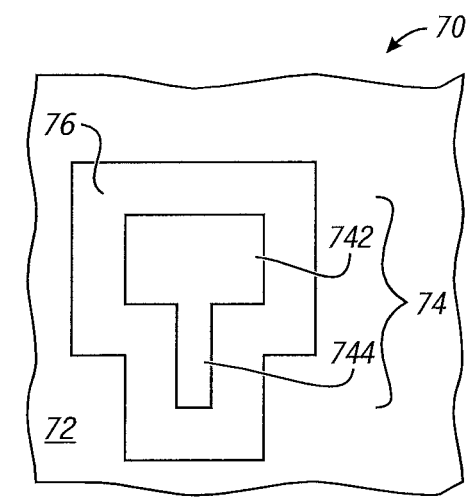
FIG. 7 includes a top view of another particular feature within another trench in accordance the concepts as described herein.
Figure 8:
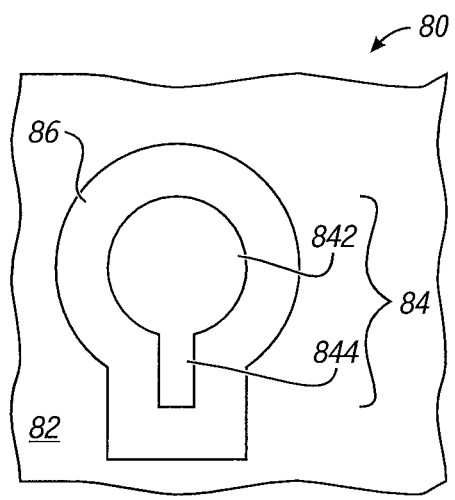
FIG. 8 includes a top view of another particular feature within another trench in accordance the concepts as described herein.

Other shapes for the features can be used that have segments that can help to increase mechanical stability in the embodiments as illustrated in FIGS. 6 to 10. FIG. 6 includes an illustration of a top view of a portion of a workpiece 60 that includes a die substrate 62, a feature 64 having a shape of a cross, and a trench 66 between the die substrate 62 and the feature 64. The feature 64 includes segments 642, 644, 646, and 648 each extending in a different directions from the center of the feature 64. The features may have only two segments. FIG. 7 includes an illustration of a top view of a portion of a workpiece 70 that includes a die substrate 72, a feature 74 having a shape of a cross, and a trench 76 between the die substrate 72 and the feature 74. The feature 74 includes segments 742 and 744 each extending in a different directions from the center of the feature 74. The segments 742 and 744 have different widths. The features do not need to have segments that have rectilinear shapes. FIG. 8 includes an illustration of a top view of a portion of a workpiece 80 that includes a die substrate 82, a feature 84, and a trench 86 between the die substrate 82 and the feature 84. The feature 84 includes a curved segment 842 and a rectilinear segment 844. The curved segment 842 can be generally circular (illustrated), oval, oblong, or another curved shape. The rectilinear segment 844 can help to provide mechanical stability to the curved segment 842, or vice versa.

Figure 9:
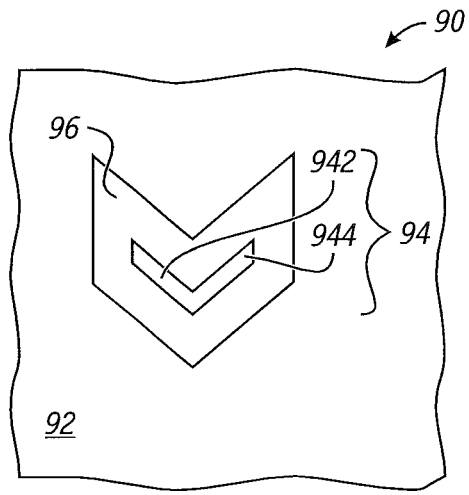
FIG. 9 includes a top view of another particular feature within another trench in accordance the concepts as described herein.
Figure 10:
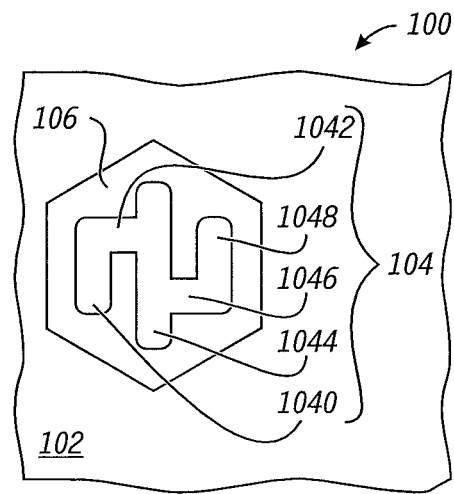
FIG. 10 includes a top view of another particular feature within another trench in accordance the concepts as described herein.

The features do not need to have segments that intersect one another at an acute angle. FIG. 9 includes an illustration of a top view of a portion of a workpiece 90 that includes a die substrate 92, a feature 94 having a V-shape, and a trench 96 between the die substrate 92 and the feature 94. The feature 94 includes segments 942 and 944 that intersect at an acute angle. The features can be relatively complex. The shape of the trench 106 does not have to match the outer perimeter of the feature. FIG. 10 includes an illustration of a top view of a portion of a workpiece 100 that includes a die substrate 102, a feature 104, and a trench 106 between the die substrate 102 and the feature 104. Note that the trench 106 has an outer perimeter that is a hexagon, and the feature 104 does not have an outer perimeter that is complex and not a hexagonal. The hexagonal shape of the outer perimeter of the trench 106 may be useful for automated physical design tools. In FIG. 10, the feature 104 includes vertical segments 1040, 1044, and 1048 and horizontal segments 1042 and 1046.

The previously described values for dimensions S and T and their relationships with respect to FIGS. 2 and 3 can be used for the features and trenches in FIGS. 6 to 10. Note that in FIG. 10, the vertical segment 1044 is spaced apart from vertical segments 1040 and 1048 by the value T, as the space between the vertical segments 1040, 1044, and 1048 are portions of the trench 106.

Figure 11:
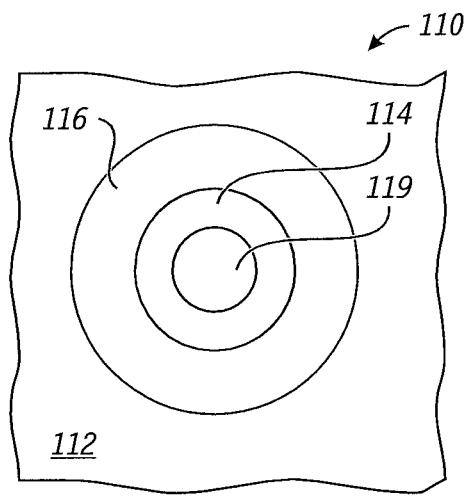
FIG. 11 includes a top view of another particular feature within another trench in accordance the concepts as described herein.

Annular features may be used to increase mechanical stability of features. FIG. 11 includes an illustration of a top view of a portion of a workpiece 110 that includes a die substrate 112, a feature 114 having a circular annulus, a trench 116 between the die substrate 112 and the feature 114, and a trench 119 defined by the annulus. The annular shape of the feature 114 allows the feature to have a smaller outer diameter as compared to the diameter of the feature 14 in FIG. 1 while still maintaining mechanical stability. For example, the outer diameter of the feature 114 of FIG. 11 may be approximately 3 microns and still allow the trenches 116 and 119 to be over 40 microns deep, and in another embodiment over 100 microns deep. The feature 14 of FIG. 1 would likely need a diameter of at least 30 microns to achieve similar mechanical stability at a depth of approximately 40 microns.

Figure 12:
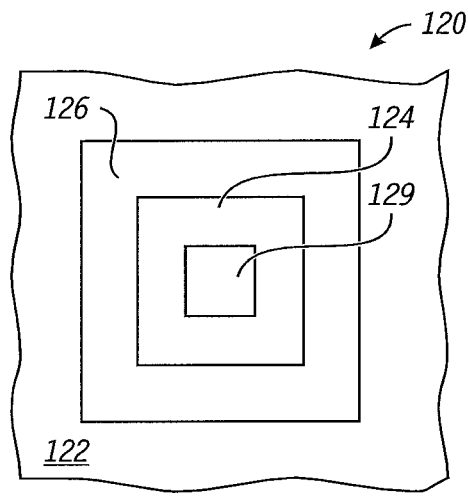
FIG. 12 includes a top view of another particular feature within another trench in accordance the concepts as described herein.
Figure 13:
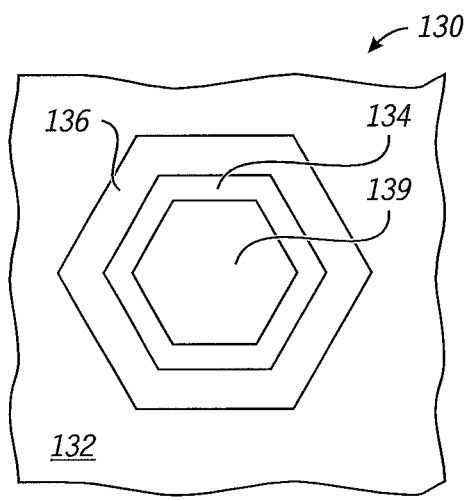
FIG. 13 includes a top view of another particular feature within another trench in accordance the concepts as described herein.

The shape of the annular feature does not need to be circular. FIG. 12 includes an illustration of a top view of a portion of a workpiece 120 that includes a die substrate 122, a feature 124 having a square or rectangular annulus, a trench 126 between the die substrate 122 and the feature 124, and a trench 129 defined by the annulus. In still other embodiments, other shapes may be used for annular features. FIG. 13 includes an illustration of a top view of a portion of a workpiece 130 that includes a die substrate 132, a feature 134 having a hexagonal annulus, a trench 136 between the die substrate 132 and the feature 134, and a trench 139 defined by the annulus. In still other embodiments, other shapes may be used for annular features. The previously described values for dimensions S and T and their relationships with respect to FIGS. 2 and 3 can be used for the features and trenches in FIGS. 11 to 13.

A variety of different shapes of features and trenches have been disclosed. After reading this specification, skilled artisans will appreciate that many other shapes for features and trenches can be used without departing from the teachings herein.

FIGS. 14 to 23 illustrate embodiments in which arrays of features can be used based on cells described in the preceding figures. In general, the number of trenches corresponds to the number of components or parts of a larger component that will be formed within the die substrate. Similar to the cells previously described, the particular embodiments as illustrated and described herein are merely exemplary and do not limit the concepts as described herein.

Figure 14:
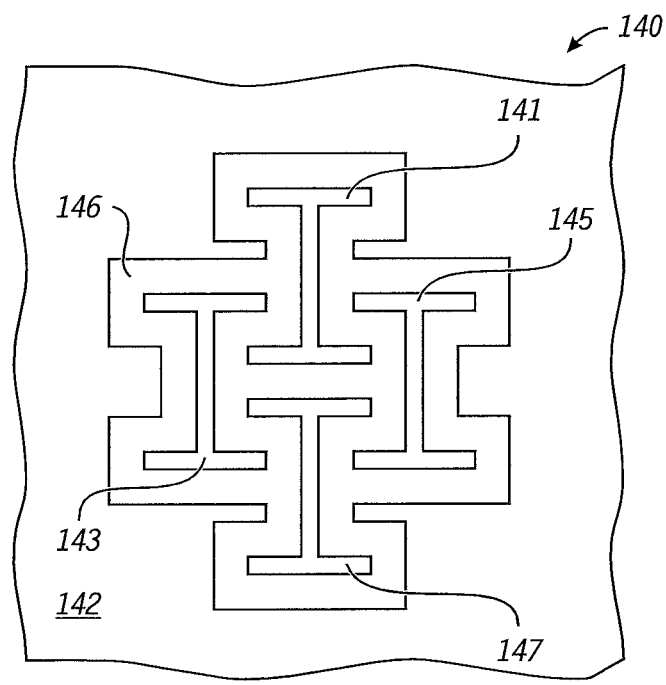
FIG. 14 includes a top view of a particular set features within a trench in accordance the concepts as described herein.
Figure 15:
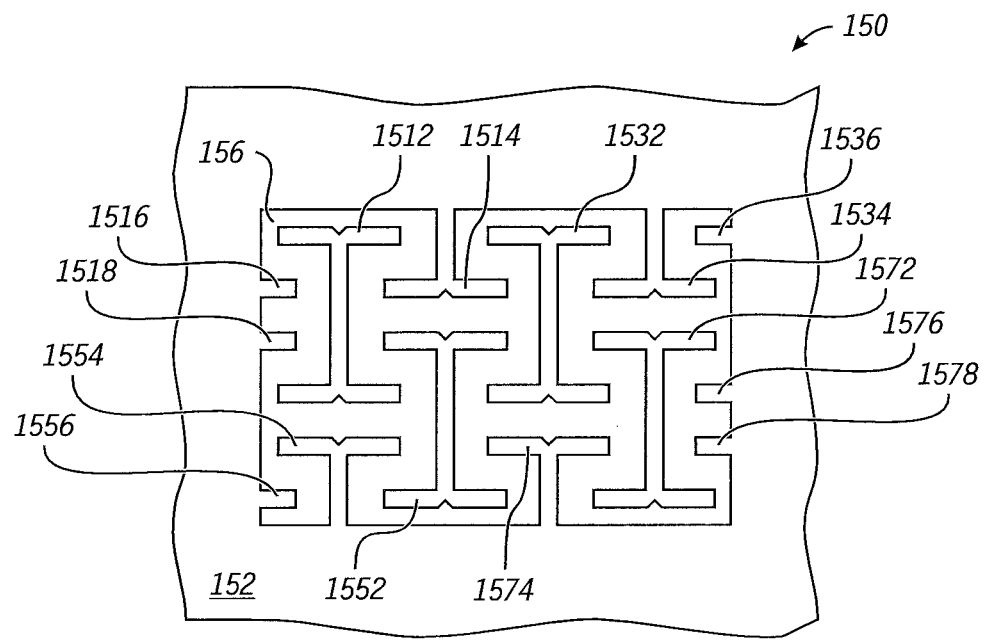
FIG. 15 includes a top view of another particular set features within another trench in accordance the concepts as described herein.

FIGS. 14 and 15 illustrate features having I-beam shapes located within a trench. FIGS. 14 and 15 can have a relatively dense packing of features in the trench by staggering the positions of the features along a row or a column Each of FIGS. 14 and 15 can be used in forming an electronic component within the trench or an isolation structure that substantially fills the area defined by the trench illustrated. In a particular embodiment, the isolation structure substantially completely fills the area defined by the trench illustrated. Features may be selectively connected using conductive interconnections on either the top surface, bottom surface or both surfaces.

FIG. 14 includes an illustration of a top view of a portion of a workpiece 140 that includes a die substrate 142, features 141, 143, 145, and 147, and a trench 146 between the die substrate 142 and the features 141, 143, 145, and 147 and between the features themselves. Each of the features 141, 143, 145, and 147 are based on the feature 24 in FIG. 2. FIG. 15 includes an illustration of a top view of a portion of a workpiece 150 that includes a die substrate 152, features 1512, 1532, 1552, and 1572, partial features 1514, 1516, 1518, 1534, 1536, 1554, 1556, 1574, 1576, and 1578, and a trench 156 between the die substrate 152 and the features 151, 153, 155, and 157 and between the features themselves. Each of the features and partial features are based on the feature 34 in FIG. 3. The physical design of the embodiment in FIG. 15 is well suited for forming an isolation structure by thermal oxidation.

Figure 16:
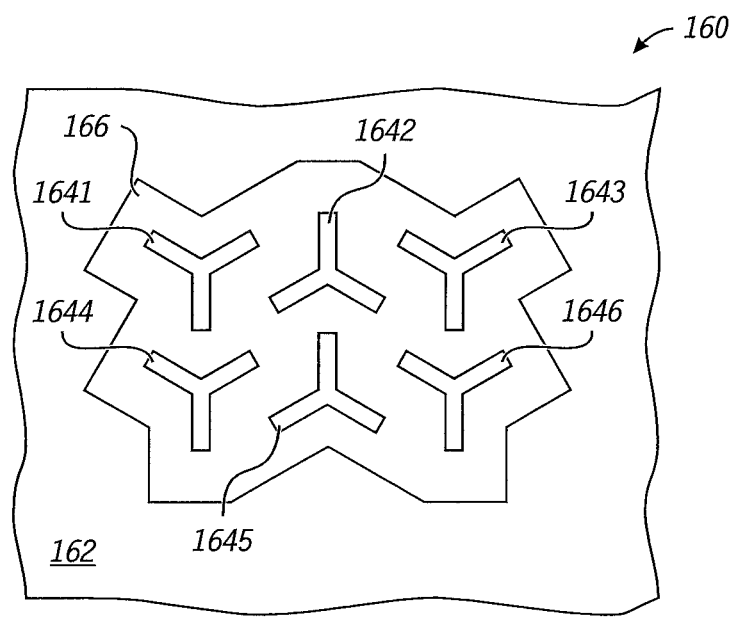
FIG. 16 includes a top view of another particular set features within another trench in accordance the concepts as described herein.
Figure 17:
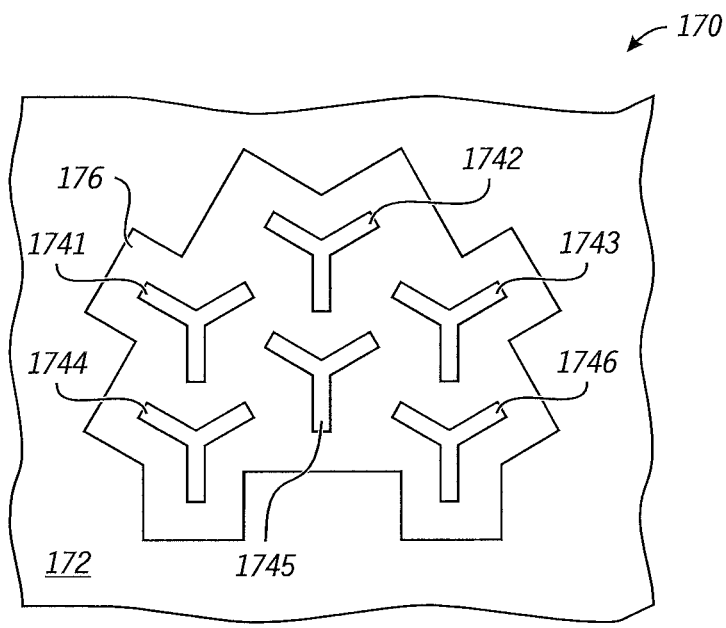
FIG. 17 includes a top view of another particular set features within another trench in accordance the concepts as described herein.
Figure 18:
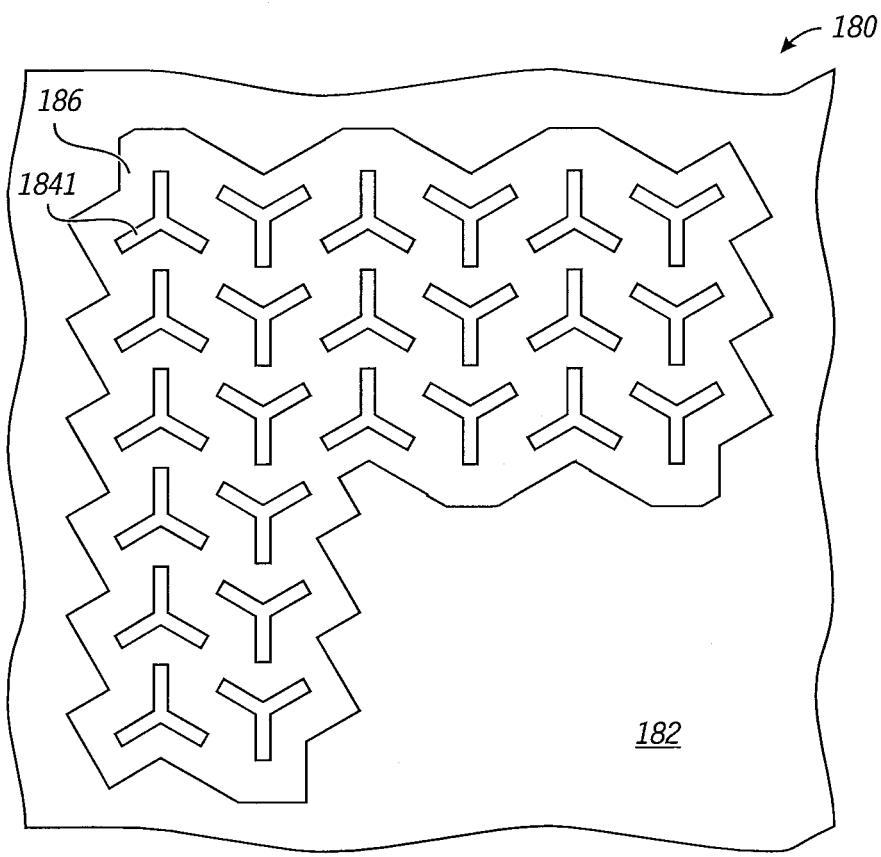
FIG. 18 includes a top view of another particular set features within another trench in accordance the concepts as described herein.

FIGS. 16 to 18 illustrate features having Y-shapes located within a trench. FIG. 16 includes an illustration of a top view of a portion of a workpiece 160 that includes a die substrate 162, features 1641 to 1646, and a trench 166 between the die substrate 162 and the features 1641 to 1646 and between the features themselves. Each of the features 1641 to 1646 and the trench 166 are based on the feature 54 and trench 56 in FIG. 5. Note that features 1641 to 1646 are oriented in rows and columns, wherein the orientation of the features 1641 to 1646 alternate between immediately adjacent rows. The physical design of the embodiment in FIG. 16 is well suited for forming an isolation structure by thermal oxidation.

FIG. 17 includes an illustration of a top view of a portion of a workpiece 170 that includes a die substrate 172, features 1741 to 1746, and a trench 176 between the die substrate 172 and the features 1741 to 1746 and between the features themselves. Each of the features 1741 to 1746 and the trench 176 are based on the feature 54 and trench 56 in FIG. 5. Note that features 1741 to 1746 are oriented in rows and columns, wherein the orientation of the features are such that along a column, the centers of the feature lie along a line, and along a row, the centers of the features are staggered.

FIG. 18 includes an illustration of a top view of a portion of a workpiece 180 that includes a die substrate 182, features, including a feature 1841, and a trench 186 between the die substrate 182 and the features and between the features themselves. Each of the features is based on the feature 44 and trench 46 in FIG. 4. Note that the features are oriented similar to the features in FIG. 16. Note that the overall shape of the trench 186 makes a 90° bend. Such a bend can be used to avoid forming the trench where electronic components have been or will subsequently be formed. The electronic components can include active components, such as transistors, or passive components, such as resistors, capacitors, diodes, or the like. In another embodiment (not illustrated), the overall shape of the trench can form a different angle, such as 45°.

Figure 19:
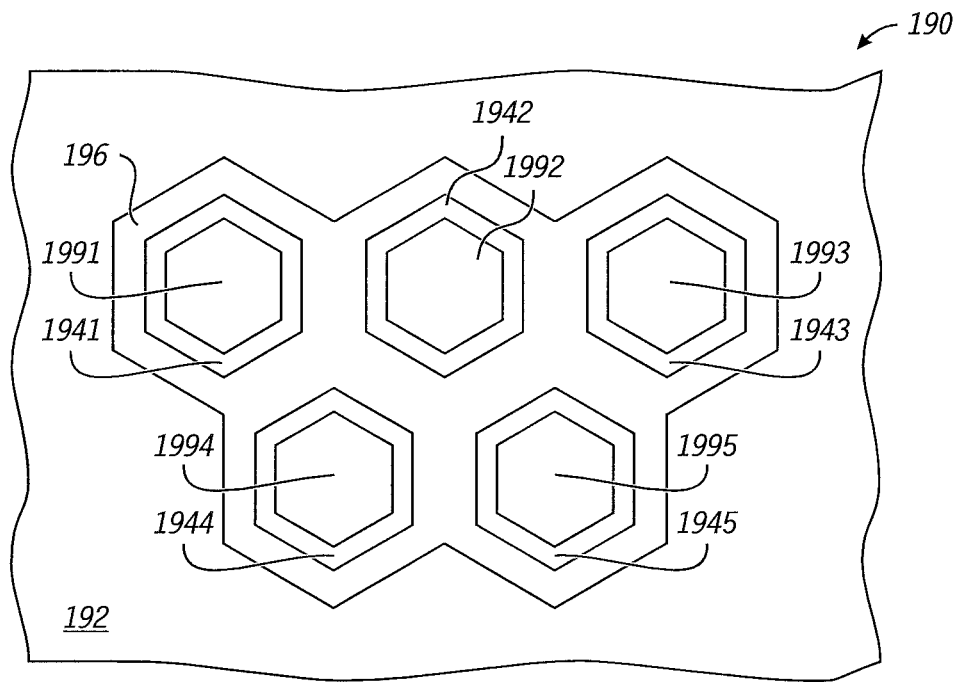
FIG. 19 includes a top view of another particular set features within another trench in accordance the concepts as described herein.

Annular features can be used in the arrays. FIG. 19 includes an illustration of a top view of a portion of a workpiece 190 that includes a die substrate 192, features 1941 to 1945 that define annuli 1991 to 1995, and a trench 196 between the die substrate 192 and the features 1941 to 1945 and between the features themselves. Each of the features 1941 to 1945, the trench 196, and annuli 1991 to 1995 are based on the feature 134, the trench 136, and annulus 139 in FIG. 13. An electronic component can be formed within each of the trench 196 and the annuli 1991 to 1995.

Figure 20:
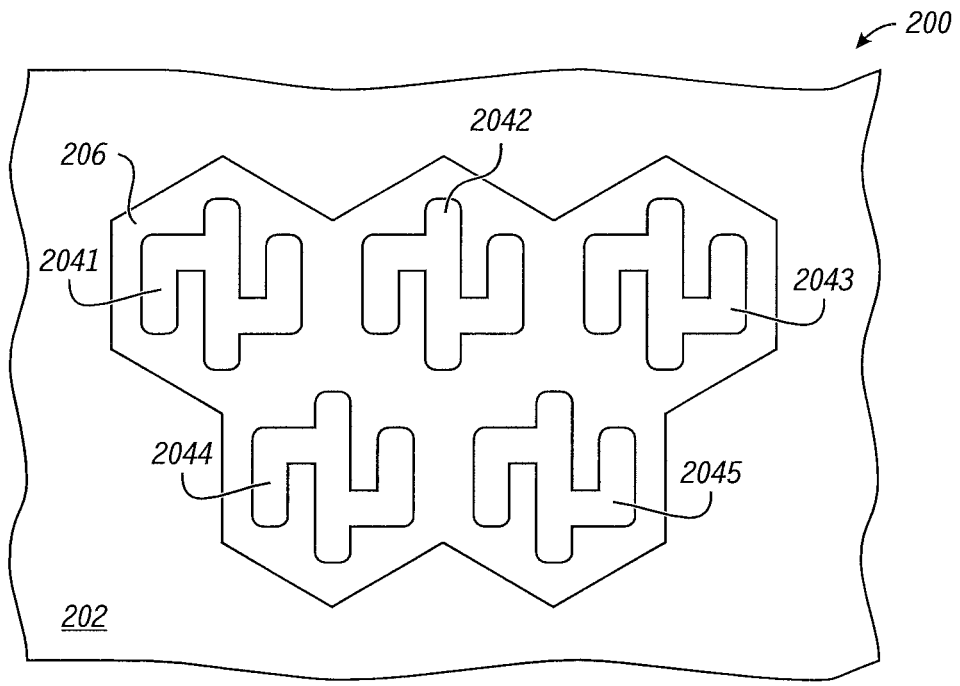
FIG. 20 includes a top view of another particular set features within another trench in accordance the concepts as described herein.

Complex features may also be arranged in an array pattern. FIG. 20 includes an illustration of a top view of a portion of a workpiece 200 that includes a die substrate 202, features 2041 to 2045, and a trench 206 between the die substrate 202 and the features 2041 to 2045 and between the features themselves. Each of the features 2041 to 2045 and the trench 206 are based on the feature 104 and the trench 106 in FIG. 10.

Figures 21, 22:
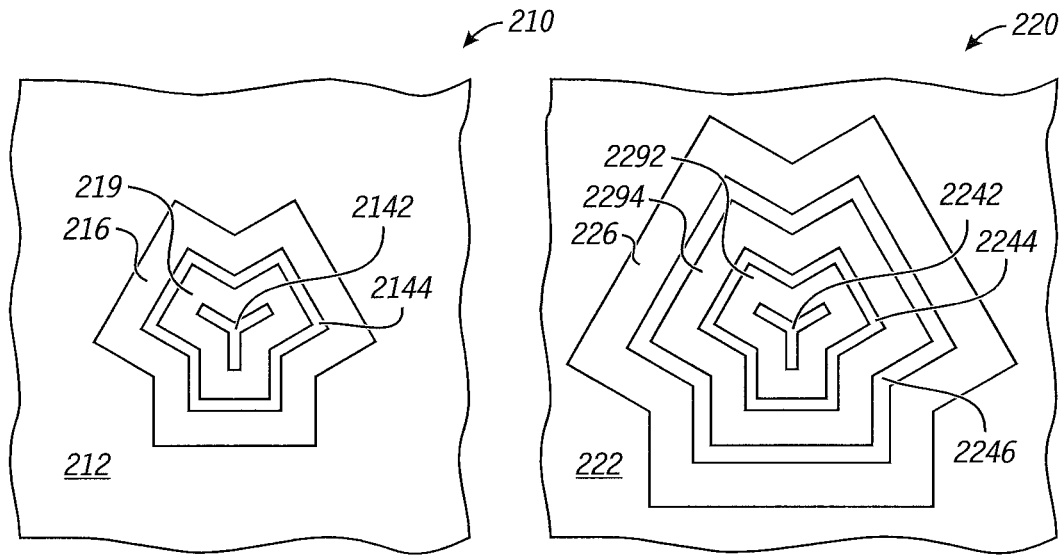
FIG. 21 includes a top view of a coaxial feedthrough that includes the feature of FIG. 5.
FIG. 22 includes a top view of a triaxial feedthrough that includes the feature of FIG. 5.

FIGS. 21 and 22 illustrate physical designs that can be used for n-axial connectors. FIG. 21 includes an illustration of a top view of a portion of a workpiece 210 that includes a die substrate 212, features 2142 and 2144, annulus 219, and a trench 216 between the die substrate 212 and the feature 2144. The physical design of FIG. 21 can be used for forming a coaxial connector when a conductive material is formed within the annulus 219 and the trench 216. FIG. 22 includes an illustration of a top view of a portion of a workpiece 220 that includes a die substrate 222, features 2242, 2244, and 2246, annuli 2292 and 2294, and a trench 226 between the die substrate 222 and the feature 2246. The physical design of FIG. 22 can be used for forming a triaxial connector when a conductive material is formed within the annuli 2292 and 2294 and within the trench 226. Higher order axial connector may be created by including more annular features that would surround the features 2242.

Figure 23:
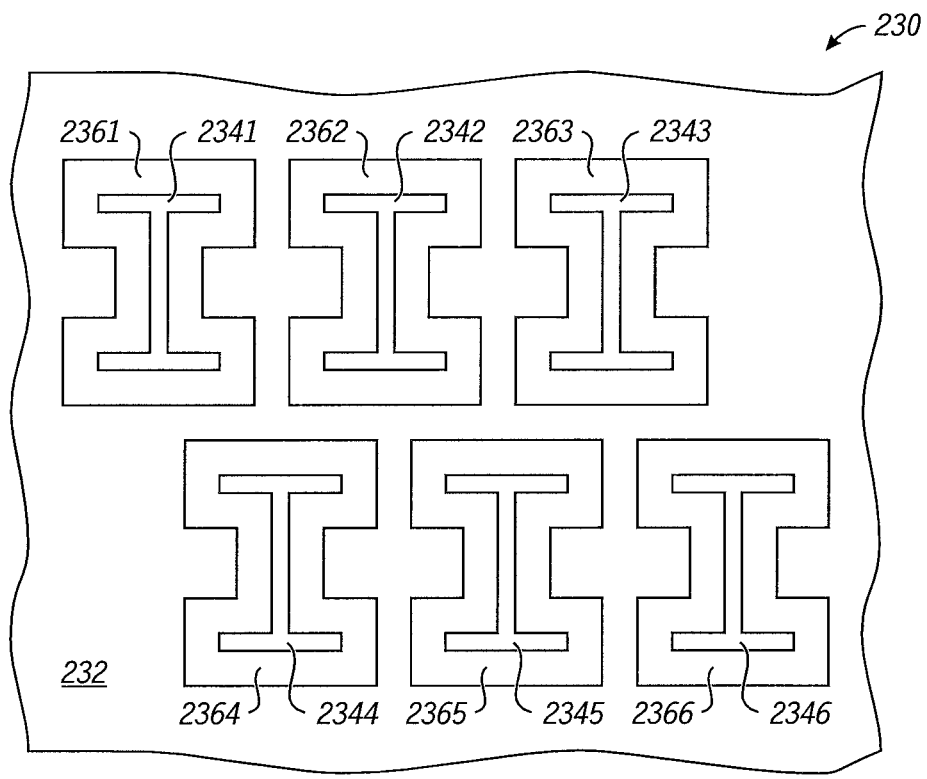
FIG. 23 includes a top view of a particular set features within a particular set of trenches in accordance the concepts as described herein.

More than one trench can be used. FIG. 23 includes an illustration of a top view of a portion of a workpiece 230 that includes a die substrate 232, features 2341 to 2346 and trenches 2361 to 2366 between the die substrate 232 and their corresponding features 2341 to 2346. The organization of the trench/feature combinations (that is, a combination of a trench and its corresponding feature) can be in rows and columns As illustrated, the trench/feature combinations are organized along straight rows and staggered or diagonal columns Other organizations can be used. For example, the organization can include straight columns or interdigitated columns for increased packing efficiency.

While exemplary physical designs have been illustrated in FIGS. 2 to 23, other physical designs can be used. Many of the aspects of the illustrated trenches and figures can be put into other combinations. For example, any of the cells illustrated in FIGS. 6 to 9, 11, and 12 may be modified, so that a plurality of features are located within a single trench. In another embodiment, a plurality of trench/feature combinations, such as any of the features illustrated in FIGS. 3 to 13 can be implemented similar to the embodiment of FIG. 23. Many different organizations of such trench/feature combinations may be used. In still a further embodiment, the die substrate may define different trenches wherein the trenches include different numbers of features. In yet another embodiment, different shapes of features can be used for the same die substrate, and in a particular embodiment, different shapes of features may be located within the same trench.

Many different physical designs of a trench or set of trenches can be tailored to a particular application. In an embodiment, a trench or set of trenches can be located over which a bond pad will be formed. In another embodiment, a trench or set of trenches may be formed in unused portions of the die substrate, such as between functional units of the integrated circuit. For example, the trench or set of trenches may be located between a high-voltage component and its associated control circuitry, between a memory array and a processing unit (e.g., a central processing unit, a graphical processing unit, etc.). In a further embodiment, a single trench with a plurality of features may surround a region including electronic components that are relatively sensitive to signals or the operation of other electronic components in a different region outside the trench. A grounding plane (or other substantially constant voltage structure) or an insulating material may be formed within the trench. After reading this specification, skilled artisans will appreciate that many other physical designs can be tailored to particular applications.

The different physical designs can allow different electrical configurations between electronic components to be made. A single trench can be useful for forming an isolation region or a single electronic component. When the single trench includes a plurality of features, the volume and surface areas within the trench increases. A relatively large via or a relatively high-capacitance capacitor can be formed in such a trench. A plurality of trenches can be useful for making arrays of structures that can allow some or all of the structures to be connected in series, parallel, or a combination of series and parallel. Such a configuration can be particularly well suited for tuning an integrated circuit for a particular application. In an embodiment, the number of structures connected and how they are connected (for example, series versus parallel) can affect the number of turns of an inductor, a cumulative resistance, a cumulative capacitance, or the like. For example, an antenna that is to operate at a particular frequency may require a two-turn inductor, and an antenna that is to operate at another particular frequency may require a five-turn inductor. Fuse or anti-fuse connectors may be used, and a laser or other localized energy source can be used to blow fuses or to complete the circuit (for anti-fuses). The ability to have different electrical connections (or a lack thereof) allows for much greater flexibility to have many potential circuit configurations possible. After reading this specification, skilled artisans will be able to determine how to implement a particular physical design for a particular application.

Figure 24:
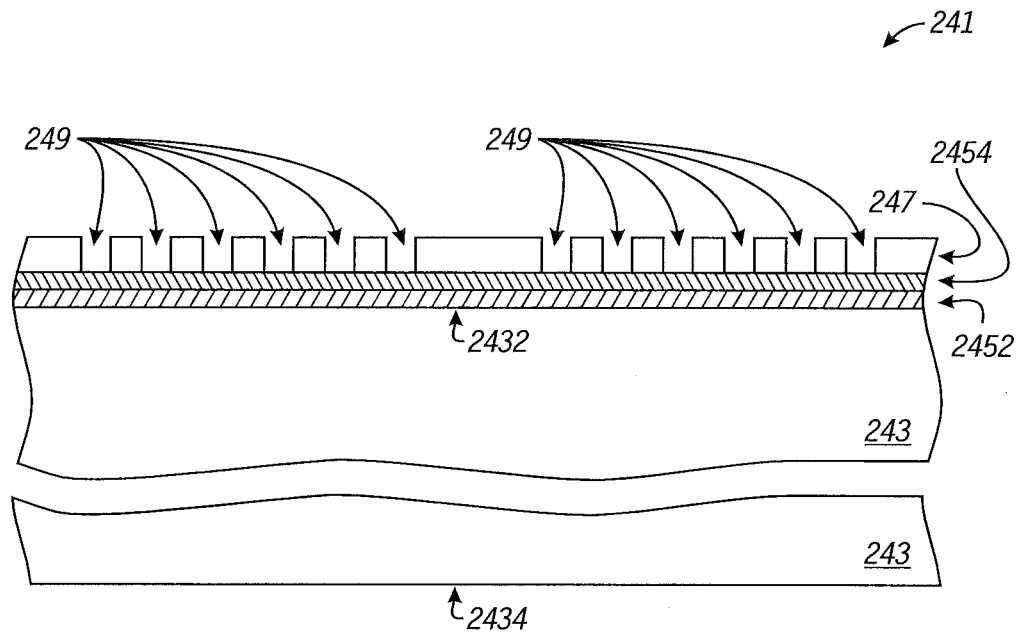
FIG. 24 includes an illustration of a cross-sectional view of a portion of a workpiece after forming layer over a substrate.

Attention is directed to a process of forming an electronic device that includes trenches and features. FIG. 24 includes an illustration of a cross-sectional view of a portion of a workpiece 241 that includes a die substrate 243. The die substrate 243 can include a monocrystalline semiconductor wafer, a semiconductor-on-insulator wafer, a flat panel display (e.g., a silicon layer over a glass plate), or another substrate conventionally used to form electronic devices. The portion of the die substrate 243 as illustrated in FIG. 24 includes a Group 14 element (e.g., carbon, silicon, germanium, or any combination thereof) that includes an n-type or p-type dopant. In another embodiment, the die substrate 243 includes a III-V or II-VI semiconductor material.

The die substrate 243 includes major surfaces 2432 and 2434 that are separated by an initial thickness. Active and other electronic components will be formed within or over the major surface 2432. In a particular embodiment, no electronic components are formed along the major surface 2434 because a subsequent backgrind or other operation will be performed to significantly reduce the thickness of the die substrate 243. When the die substrate 243 is in the form of a wafer, the initial thickness substantially corresponds to the thickness of the wafer before any processing is performed. In an embodiment, the thickness may be no greater than approximately 2000 microns, and in another embodiment, the thickness may be no greater than approximately 900 microns. In a further embodiment, the thickness is at least approximately 300 microns, and in another further embodiment, the thickness is at least approximately 400 microns. In a particular embodiment, the thickness is in a range of approximately 600 to approximately 800 microns.

An insulating layer 2452 and a stopping layer 2454 (e.g., a polish-stop layer or an etch-stop layer) are sequentially formed over the substrate 243 using a thermal growth technique, a deposition technique, or a combination thereof. Each of the pad layer 2452 and the stopping layer 2454 can include an oxide, a nitride, an oxynitride, another suitable material, or any combination thereof. In an embodiment, the pad layer 2452 has a different composition as compared to the stopping layer 2454. In a particular embodiment, the pad layer 2452 includes an oxide, and the stopping layer 2454 includes a nitride. A mask layer 247 is formed over the stopping layer 2454 and is patterned to define openings 249 under which trenches in the substrate 243 will be formed. From a top view (not illustrated), the openings 249 correspond to the shape of the trenches to be formed, such as the trenches in FIGS. 2 to 23. In an embodiment, the mask layer 247 includes an organic resist material and has a thickness of at least 0.8 microns. If needed or desired, the thickness of the mask layer 247 can be increased, as trenches that will be subsequently formed can be significantly deep. For example, the mask layer 247 can be at least approximately 1.2 microns thick or at least approximately 1.5 microns thick. Further, the mask layer 247 can include a plurality of films.

Figure 25:
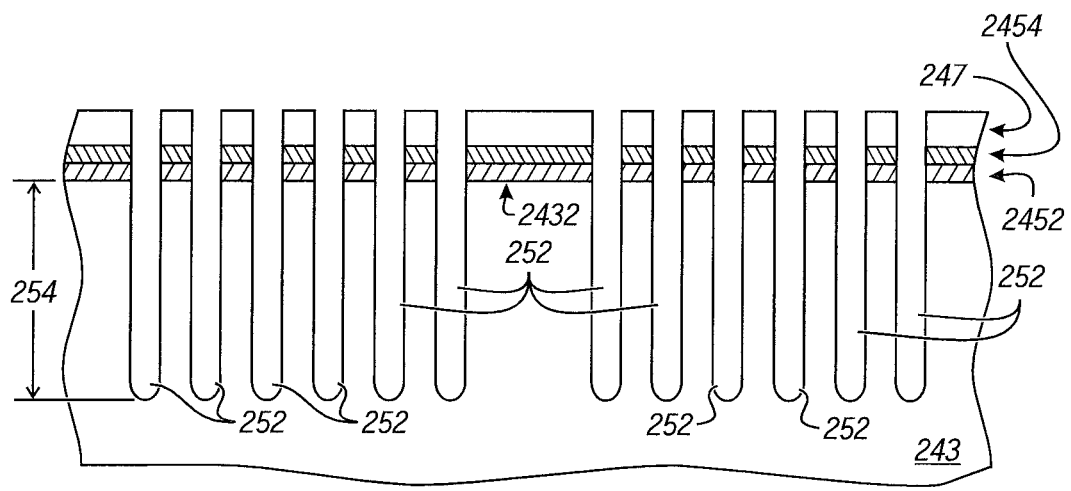
FIG. 25 includes an illustration of a cross-sectional view of the workpiece of FIG. 24 after etching trenches into the substrate.

An etch operation is performed to pattern the pad layer 2452, stopping layer 2454, and substrate 243 to define trenches 252, as illustrated in FIG. 25. Although not illustrated in FIG. 25 to simplify the drawing, the substrate 243 extends to the major surface 2434 as illustrated in FIG. 24. Referring to FIG. 25, the trenches have a depth 254 as measured from the major surface 2432. The depth 254 can be at least approximately 40 microns. In an embodiment, the depth 254 can be at least approximately 75 microns, and in another embodiment, can be at least approximately 110 microns, at least approximately 200 microns, or more. The shapes of the trenches 252 can be a little narrower near the bottom of the trench as compared to a location closer to the major surface 2432. Thus, the widths of the features and trenches as previously described with respect to FIGS. 2 to 23 may be tapered. The bottoms of the trenches are generally flat; however the corners between the sidewalls and bottom of each trench may be rounded. The etch is performed by any number of deep silicon etch tools using an etch process, such as a process as described in U.S. Pat. No. 7,285,228, which is incorporated herein by reference in its entirety. The process disclosed in the patent is a well-known process for high aspect ratio deep silicon etching that cycles between isotropic surface passivation of the trench walls, reactive ion etch passivation clearing at the trench bottom, and isotropic silicon etching of the trench bottom opening. In an embodiment, the selectivity of silicon to an organic resist material can be in a range of approximately 80:1 to 100:1. If a mask uses a metal that is not significantly etched by fluorine, such as an MN mask, the selectivity can be substantially higher. Vertical or tapered or shaped trenches can be controlled by the etching conditions. After forming the trenches 252, the mask layer 247 is removed.

The portions of the die substrate 243 between the trenches 252 correspond to features, such as any of the features previously described with respect to FIGS. 2 to 23. At any particular elevation, the composition and crystal orientation of the features are substantially the same as the die substrate 243. Thus, if the die substrate 243 is a substantially monocrystalline semiconductor wafer with a (100) crystal plane along the major surface 2432, then the features will also be substantially monocrystalline semiconductor with uppermost surfaces along the (100) crystal plane. If the die substrate 243 has a substantially constant doping profile at different elevations along the depth 254 of the trenches, the features will likewise have the same doping profile. If the die substrate 243 is a semiconductor-on-insulating wafer (not illustrated) and the trenches 252 extend through the insulating layer, each of the die substrate 243 and the features will have substantially the same thicknesses of the semiconductor and insulating layers disposed over a bulk semiconductor substrate.

Figure 26:
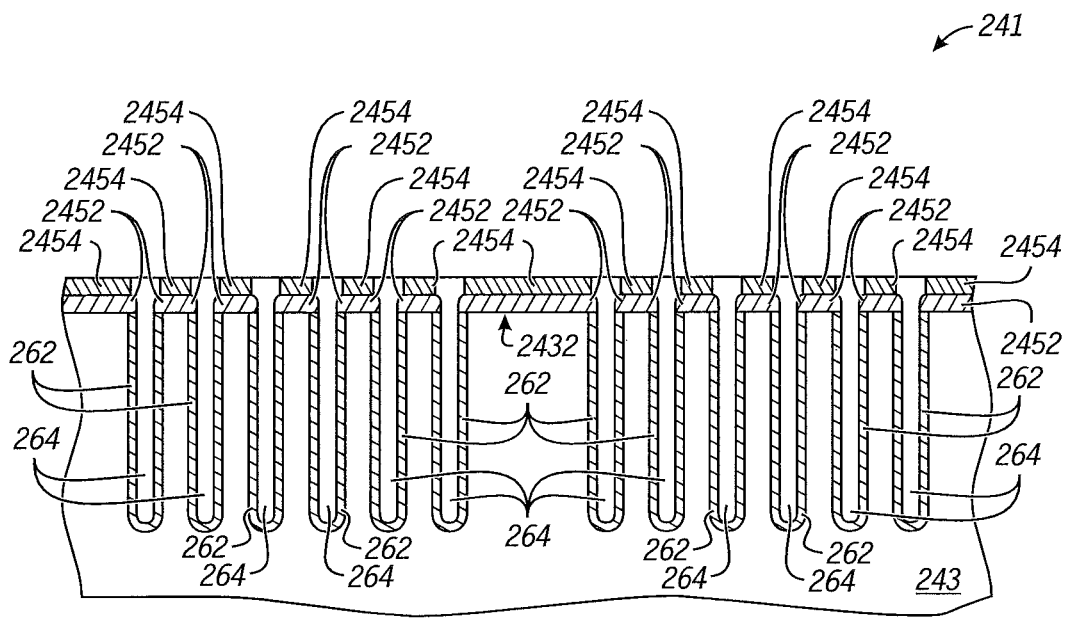
FIG. 26 includes an illustration of a cross-sectional view of the workpiece of FIG. 27 after forming a liner insulating layer and filling the remainder of the trenches with a material.

FIG. 26 includes an illustration of a cross-sectional view of the workpiece 241 after forming an insulating layer 262 and filling the trenches with a material 264. Note that the shapes of the trenches and features are formed using shapes as described with respect to FIGS. 2 to 23, the shape of the features between the trenches are substantially as formed. In other words, the features do not significantly bend, twist, or otherwise move within the trenches as the trenches are filled. Thus, the movement seen with features of the same general size as used in the prior art can be reduced or even substantially eliminated. As a result, smaller dimensions may be used in the structures, leading to a more efficient use of area.

The insulating layer 262 can be formed to insulate the sidewalls and bottoms of the trenches before forming the material 264. In an embodiment, the insulating layer 262 has a thickness no greater than 90 nm, and in another embodiment, has a thickness no greater than 50 nm. In a further embodiment, the insulating layer 262 has a thickness of at least 11 nm, and in still a further embodiment, the insulating layer 262 has a thickness of at least 20 nm. In a further embodiment, the insulating layer may not be present. The insulating layer 262 can include an oxide, a nitride, or an oxynitride and can be formed thermally or by a deposition. In a particular embodiment, a thermal oxidation is performed to form the insulating layer 262. When the stopping layer 2454 includes a nitride, the stopping layer 2454 can act as an oxidation barrier to reduce the oxidation of the substrate 243 along the major surface 2432.

The material 264 can include a single material or a plurality of materials that can be in the form of layer, a plurality of layers, a single film, or a plurality of films. The material 264 can be conductive, resistive, an insulator, or a combination therefore (for example, when forming capacitors within the trenches). The actual material, both composition(s) and number of material(s) will depend on the electronic component being formed. In the particular embodiment illustrated in FIG. 26, through-wafer vias will be formed, and therefore, the material 262 is conductive. The material 262 includes amorphous silicon, polycrystalline silicon, a metal (an elemental metal, as opposed to a molecular compound), an alloy, a metal nitride, a metal-semiconductor compound, a metal-semiconductor-nitrogen compound, or the like. The composition of the material 262 may depend on when the material 262 is formed. Region 266 can be a region where an electronic component, such as an active component (for example, a transistor), a passive component (for example, a resistor, a capacitor, a diode, or the like), or any combination thereof are at least partly formed within the substrate 243. If the material 262 is formed before forming such electronic component within the substrate 243, the material 262 may have to withstand relatively high temperatures, such as greater than 800° C. An exemplary material can include silicon or a refractory metal element. If the material 262 is formed after forming such electronic component within the substrate 243, the material 262 may not need to withstand a temperature greater than 800° C. In a particular embodiment, the material 262 is formed just before or as part of the interlevel dielectric (ILD)/interconnect sequence, and the material 262 may be exposed to temperatures as high as 500° C. An exemplary material can include silicon or a refractory metal element, copper, silver, a noble metal element, or any combination thereof.

If needed or desired, the insulating layer 262 can be removed from a trench before forming the material 264 to form a body contact, so that the substrate 243 can be biased to a voltage that is substantially the same as the material 264. The material 264 may include an adhesion film, a barrier film, and a conductive-fill film. In a particular embodiment, the adhesion film includes a refractory metal, the barrier layer includes a refractory metal nitride, and the conductive-fill film includes a refractory metal different from the adhesion film. In another particular embodiment, the material 264 includes doped polysilicon.

The material 264 can be formed by depositing the material 264 using a chemical vapor deposition, physical vapor deposition, plating, coating, another suitable technique, or any combination thereof. In a particular embodiment, the material 264 is deposited conformally. The thickness of the material 264 is sufficient to substantially fill the trenches, and in a particular embodiment, the material 264 substantially completely fills the trenches. The actual thickness may depend on the width of the trenches. As the trenches are wider, a thicker deposition of the material 264 may be needed. In an embodiment, the thickness will be at least half of the width, and can be thicker to account for nonuniformity of the widths of the trenches, thickness of the material 264 across the substrate 243, or both. In a particular embodiment, the thickness of the material 264 may be approximately 0.9 micron when the widths of the trenches are approximately 1.6 microns. In another particular embodiment, the thickness of the material 264 may be approximately 1.5 micron when the widths of the trenches are approximately 2.8 microns. After reading this specification, skilled artisans will appreciate that making the material 264 too thick is safer than making the material 264 too thin. However, as the thickness increases, longer deposition times, higher costs for the material 264, and longer and more costly subsequent removal operations will result. Accordingly, in an embodiment, the thickness of the material 264 is no thicker than approximately three times the width of the widest trench, and in another embodiment, the thickness of the material 264 is no thicker than approximately twice the width of the widest trench. As deposited, the material 264 will overlie the pad layer 2452 and the stopping layer 2454 (not illustrated).

A removal operation is performed to remove a portion of the material 264 that overlies the stopping layer 2454. The removal operation can be performed using an etching or polishing technique or using a patterned etch process to leave a conductive routing layer over the stopping layer 2454 (not illustrated). The tops of the remaining portions of the material 264 may lie along substantially the same elevation as the exposed surface of the stopping layer 2454 (illustrated) or recessed below that elevation (not illustrated).

Figure 27:
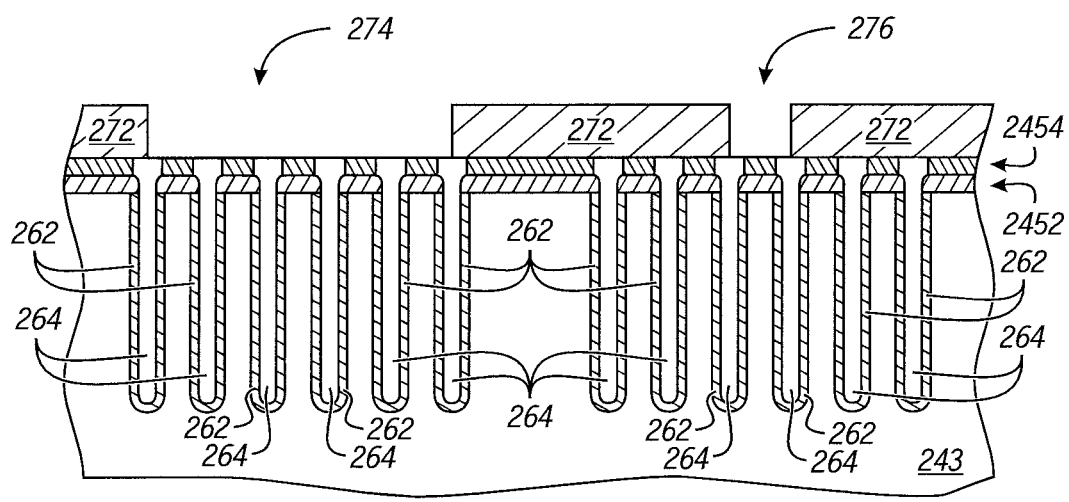
FIG. 27 includes an illustration of a cross-sectional view of the workpiece of FIG. 26 after forming and patterning an insulating layer.

An insulating layer 272 is formed along an exposed surface of the workpiece and patterned to define openings 274 and 276 over the material 264, as illustrated in FIG. 27. The trenches include a set of trenches closer to the left-hand side of the figure ("left set of trenches") and another set of trenches closest to the right-hand side of the figure ("right set of trenches"). The opening 274 exposes the material 264 within all trenches within the left set of trenches. However, the opening 276 exposes the material 264 within some, but not all, of the trenches within the right set of trenches. The significance of the openings 274 and 276 will be described in more detail later in this specification. The insulating layer 272 can include a single film or a plurality of films. The insulating layer 272 can include an oxide, a nitride, an oxynitride, or any combination thereof.

Figure 28:
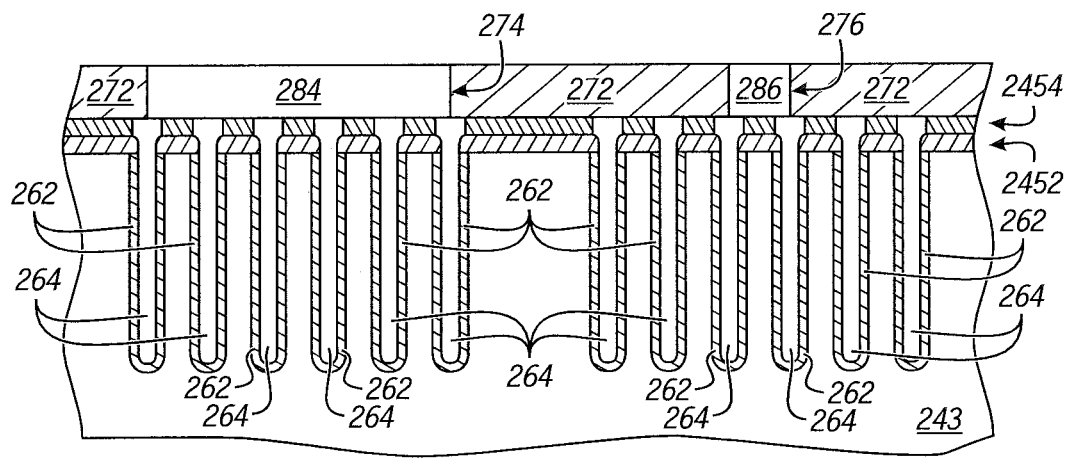
FIG. 28 includes an illustration of a cross-sectional view of the workpiece of FIG. 27 after forming interconnects.

Interconnects 284 and 286 are formed within the openings 274 and 276, respectively of the insulating layer 272, as illustrated in FIG. 28. The interconnect 284 is electrically connected to the material 264 within all trenches within left set of trenches. However, the interconnect 286 is electrically connected to the material 264 within some, but not all, of the trenches within the right set of trenches. In a particular embodiment, the interconnects 284 and 286 make direct contact with the underlying material 264. The interconnects 284 and 286 can include a single film or a plurality of films. The interconnects 284 and 286 can include any of the materials as described with respect to the material 264. The interconnects 284 and 286 may have the same or different composition as compared to the material 264.

The combination of the insulating layer 272 and interconnects 284 and 286 may be part of an interlevel dielectric layer ("ILD")/interconnect level used in conjunction with connecting other electronic components (not illustrated) that are formed at least partly within the substrate 243 or may be separate from any of the ILD/interconnect levels.

Figure 29:
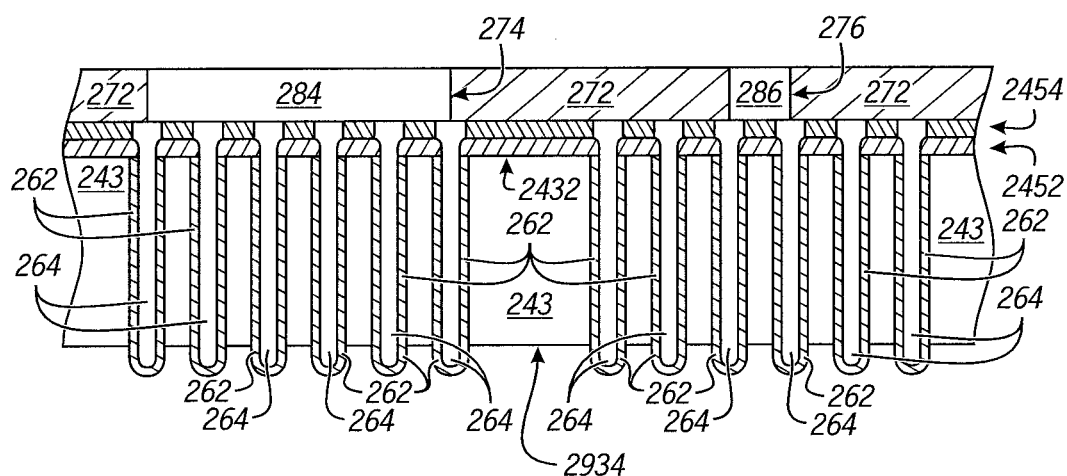
FIG. 29 includes an illustration of a cross-sectional view of the workpiece of FIG. 28 after removing a backside portion of the substrate.

A portion of the substrate 243 is removed to expose portions of the insulating layer 262, the material 264, or both. In FIG. 29, portions of the insulating layer 262 are exposed, and a major surface 2934 is opposite the major surface 2432. The removal can be performed using a single operation or a plurality of operations. In an embodiment, most of the substrate 243 is removed using a relatively faster, nonselective removal technique, such as backgrinding, polishing, or the like. Before the insulating layer 262 is exposed, a relatively slower, more selective removal technique is used. In a particular embodiment, a dry etch or wet etch may be performed.

Figure 30:
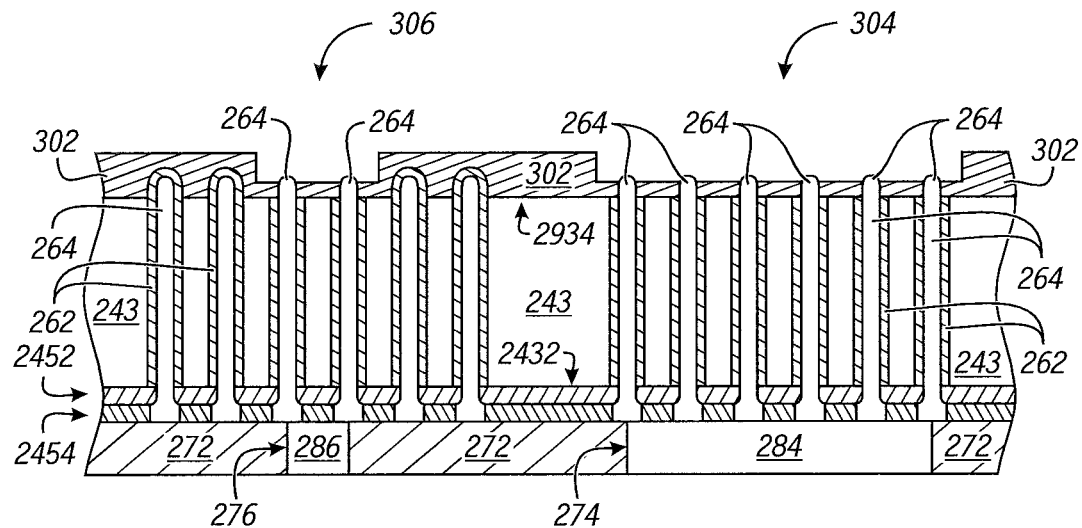
FIG. 30 includes an illustration of a cross-sectional view of the workpiece of FIG. 29 after forming and patterning an insulating layer and exposing portions of the material within the trenches.

An insulating layer 302 is formed along the major surface 2934 and is patterned to define openings 304 and 306 within which portions of the material 264 is exposed, as illustrated in FIG. 30. Note that the view of the workpiece in FIG. 30 is inverted from that of FIG. 29 (rotated 180°) to simplify understanding. In the embodiment as illustrated, the insulating layer 302 can be deposited to a thickness such that the protrusions corresponding to insulating layer 262 and the material 264 are covered. The insulating layer 302 can include a single film or a plurality of films and can include an oxide, a nitride, an oxynitride, or any combination thereof. The insulating layer 302 is then patterned to define openings 304 and 306. In an embodiment, the insulating layers 262 and 302 have similar or substantially the same etching characteristics, so that the etch chemistry or etch conditions do not need to be changed when the insulating layer 302 is reached. The etching can be performed such that an endpoint is detected when the material 264 is reached. A timed etch may be performed after the endpoint is detected to ensure portions of the material 264 is exposed within the openings 304 and 306. In a particular embodiment, the residual thickness of the insulating layer 262 within the openings can be at least 5 nm and in another embodiment, at least 11 nm The residual insulating layer 262 within the openings can help reduce the likelihood of forming an electrical short between the material 262 and the substrate 243 when a subsequent conductive material is formed within the openings 304 and 306.

Figure 31:
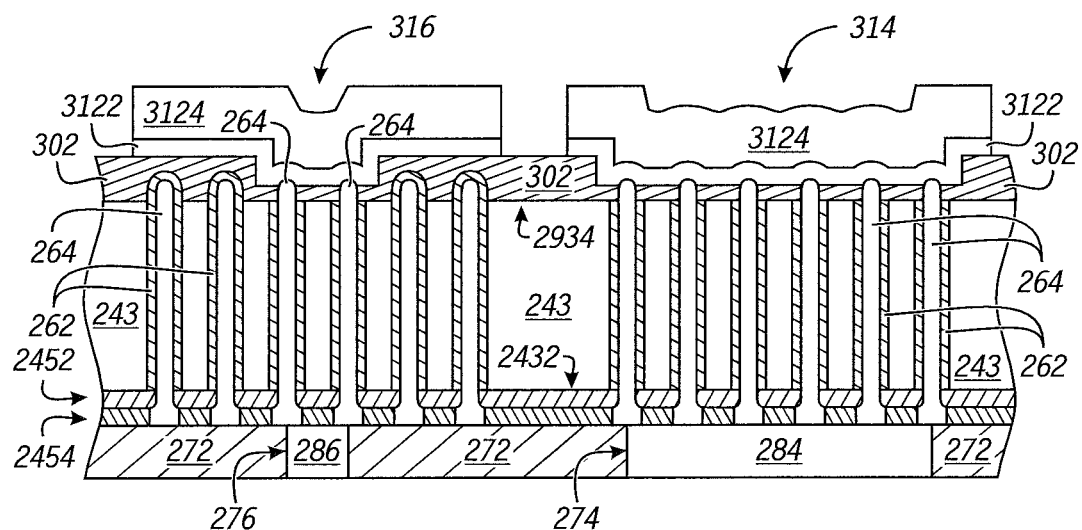
FIG. 31 includes an illustration of a cross-sectional view of the workpiece of FIG. 30 after forming underbump and bump metallization.

Conductive members 314 and 316 are formed over portions of the insulating layer 302 and within the openings in the insulating layer 302, as illustrated in FIG. 31. In the embodiment illustrated, the conductive members 314 and 316 directly contact the exposed material 264 within the openings in the insulating layer 302. The conductive member 314 is electrically connected to the interconnect 284, and the conductive member 316 is electrically connected to the interconnect 286. Thus, in an embodiment, the material 264 can be in the form of through-substrate vias that can connect an active component, a passive component, or any combination thereof along the major surface 2432 to a different component, a different die, a packaging substrate, a printed wiring board, or the like at or closer to the major surface 2934. The through-substrate via can be formed without subjecting the die substrate 243 to a drilling or cutting operation after the die substrate 243 has been formed.

The conductive members 314 and 316 can include an underbump metallization 3122 and a bump metallization 3124. The underbump metallization 3122 can include an adhesion film, a barrier film, another suitable film, or any combination thereof. The underbump metallization 3122 can include any of the materials as described with respect to the material 264. In a particular embodiment, the underbump metallization 3122 can include a metal, a metal alloy, a metal nitride, or any combination thereof, and the bump metallization 3124 can include a metal or a metal alloy that may flow at a temperature no greater than approximately 300° C., so that the bump metallization 3124 can reflow and form an electrical connection to a different die, a packaging substrate, a printed wiring board, or the like.

The conductive members 314 and 316 can be formed using a deposition technique. In an embodiment, a stencil mask (not illustrated) is placed over the substrate 243, wherein the stencil mask has openings where conductive members, such as the conductive members 314 and 316 are to be formed. The combination of the workpiece and stencil mask is placed into a deposition tool, and the underbump metallization 3122 and bump metallization 3124 can be sequentially deposited to form the conductive member 314 and 316. The use of the stencil mask may eliminate the need of a separate patterning step when forming the conductive members 314 and 316. In the embodiment as illustrated, the conductive members 314 and 316 have substantially the same length, and the pattern of the insulating layer 302 can determine which portions of the material 264 are contacted by the conductive members 314 and 316. In this manner, the same stencil mask may be used for different integrated circuit configurations. In another embodiment (not illustrated), the stencil mask can be designed so that the conductive member 316 is tailored more closely to the locations where the material 264 is contacted (that is, the conductive member 316 would have a shorter length).

In another embodiment (not illustrated), the insulating layer 302 can be deposited and not patterned with a masking layer. In this embodiment, the layer 302 would be uniformly etched or polished along the exposed surface until the material 264 at all 12 locations illustrated in FIGS. 30 and 31 would be exposed. The conductive members 314 and 316 would be formed as previously described. However, the conductive member 316 would contact all six of the underlying portions of the material 264. Because some of the portions electrically float, contact between the conductive member 316 and the material 264 would not cause an electrical short. Capacitive coupling to the substrate 243 would be higher because of contact to additional portions of the material 264. This process would not require any resist layers to be formed and patterned when processing the workpiece along the major surface 2934.

In still another embodiment, a lift-off process can be used. After forming the workpiece as illustrated in FIG. 30, a patterned resist layer can be formed such that openings defined by the resist layer overlie the openings 304 and 306. Underbump metallization can be deposited over the patterned resist layer and within the openings in the patterned resist layer and the openings 304 and 306. The patterned resist layer can be removed along with a portion of the underbump metallization overlying the patterned resist layer. Portions of the underbump metallization can remain in the openings 304 and 306. The bump metallization can be formed over the underbump metallization. In a particular embodiment, the bump metallization can be selectively formed over the underbump metallization, such as selective plating.

In a further embodiment, the insulating layer 302 and conductive members 314 and 316 can be replaced by ILD/interconnects similar to the insulating layer 272 and interconnects 284 and 286 along the opposite side of the workpiece. Other embodiments regarding interconnects, bumps, and other structures can be used.

As illustrated in FIG. 31, the material 264 is used in a through-substrate via application. In another embodiment, the material 264 can be resistive. As illustrated in FIG. 31, the resistance between the interconnect 286 and the conductive member 316 is approximately three times higher than the resistance between the interconnect 284 and the conductive member 314. In a further embodiment, the portions of the material 264 can be connected in different ways. For example, the portions of the material 264 can be connected in series rather than in parallel to allow for different values of resistance by using different configurations of connections.

Figure 32:
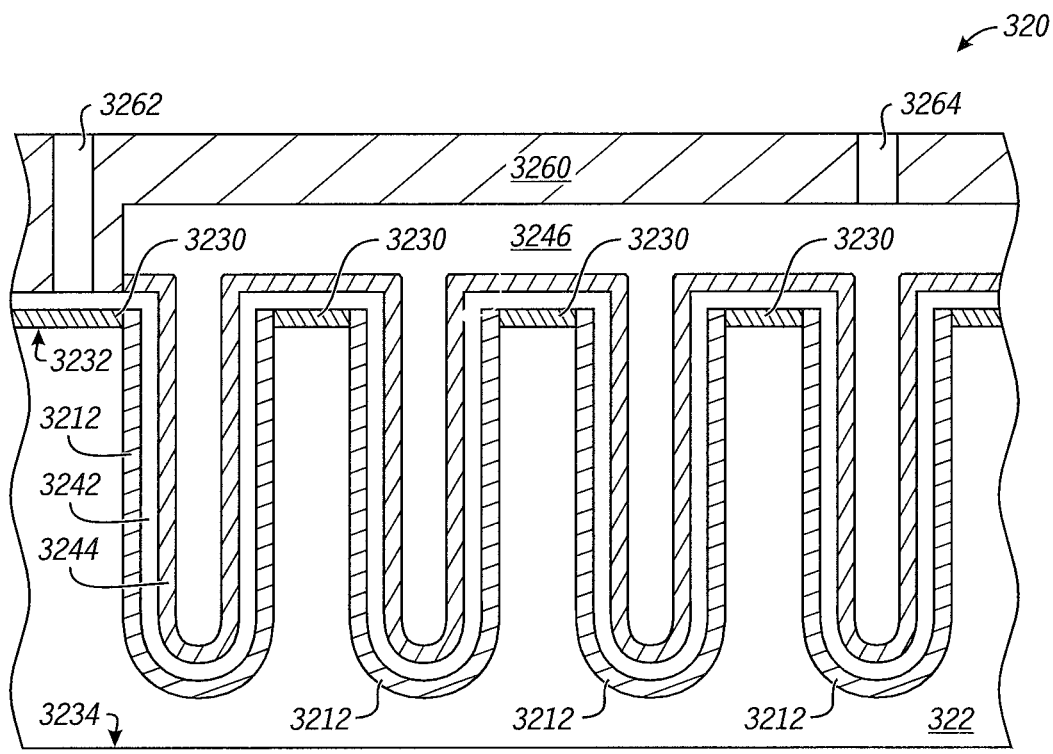
FIG. 32 includes an illustration of a cross-sectional view of a portion of a workpiece in which a capacitor is formed within the trenches and electrical connections to capacitor electrodes are along the same side of the substrate.

Other electronic components can be formed. FIG. 32 includes an illustration of a cross-sectional view of a portion of a workpiece 320 that includes a capacitor. As illustrated, the workpiece 320 includes a die substrate 322 having major surfaces 3232 and 3234. Portions of the substrate 322 between the trenches correspond to the features, such as any one or more of the features as previously described. An insulating layer 3230 is formed along the major surface 3232, trenches are formed within the substrate 322, and an insulating layer 3212 is formed along sidewalls of the trenches. The trenches are filled with a material, and in this embodiment, a combination of materials. A capacitor electrode layer 3242, a capacitor dielectric layer 3244, and another capacitor electrode layer 3246 are sequentially formed to substantially fill the trenches. The capacitor electrode layer 3246 and the capacitor dielectric layer 3244 are patterned to expose the capacitor electrode 3242. An ILD layer 3260 is deposited and patterned to define openings, and interconnects 3262 and 3264 are formed within the openings. The interconnect 3262 directly contacts the capacitor electrode layer 3242, and the interconnect 3264 directly contacts the capacitor electrode layer 3246. The substrate 322 is thinned, but in this particular embodiment, not to the bottoms of the trenches. Still, the trenches extend through most of the substrate 322. The contacts to the capacitor electrodes are along the same side of the substrate 322.

Figure 33:
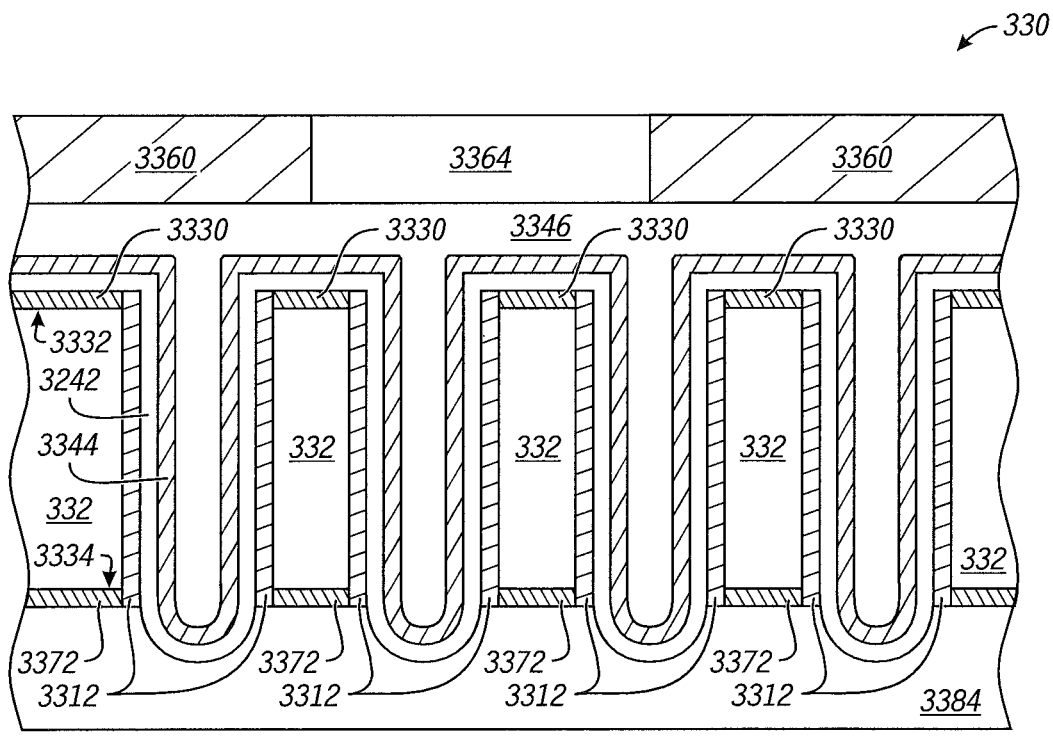
FIG. 33 includes an illustration of a cross-sectional view of a portion of a workpiece in which a capacitor is within the trenches and electrical connections to capacitor electrodes are along the opposite sides of the substrate.

FIG. 33 includes an illustration of a cross-sectional view of a portion of a workpiece 330 that includes a capacitor. As illustrated, the workpiece 330 includes a die substrate 332 having major surfaces 3332 and 3334. Portions of the substrate 332 between the trenches correspond to the features, such as any one or more of the features as previously described. An insulating layer 3330 is formed along the major surface 3332, trenches are formed within the substrate 332, and an insulating layer 3312 is formed along sidewalls of the trenches. The trenches are filled with a material, and in this embodiment, a combination of materials. A capacitor electrode layer 3342, a capacitor dielectric layer 3344, and another capacitor electrode layer 3346 are sequentially formed to substantially fill the trenches. In this embodiment, narrower trench openings, if used, will form through substrate vias when filled with capacitor electrode layer 3342 and wider trench openings will form capacitors. The capacitor electrode layer 3346 and the capacitor dielectric layer 3344 are patterned to expose the capacitor electrode 3342. An ILD layer 3360 is deposited and patterned to define an opening, and interconnect 3364 is formed within the opening. The interconnect 3364 directly contacts the capacitor electrode layer 3346. The substrate 332 is thinned, an insulating layer 3372 is deposited, and portions of the insulating layer 3372 and insulating layer 3312 are removed to expose portions of the capacitor electrode layer 3342 along bottoms of the trenches. Metallization 3384 is formed along the side of the substrate 332 opposite from the interconnect 3364. The metallization 3384 makes direct contact with the capacitor electrode layer 3342. The contacts to the capacitor electrode layers are along the opposite sides of the substrate 332.

In another embodiment, electrical contacts to a capacitor electrode layer may be made from both the same side and different sides as compared to the electrical contact to the other capacitor electrode layer. For example, metallization along one side of the die substrate may be used to supply a substantially constant voltage, such as $V_{DD}$ or $V_{SS}$ to the capacitor electrode and also supply such substantially constant voltage to an active component, such as to a source or drain of a field-effect transistor, or to a passive component, such as another capacitor, a resistor, or a diode, at least partly formed within the die substrate.

Figure 34:
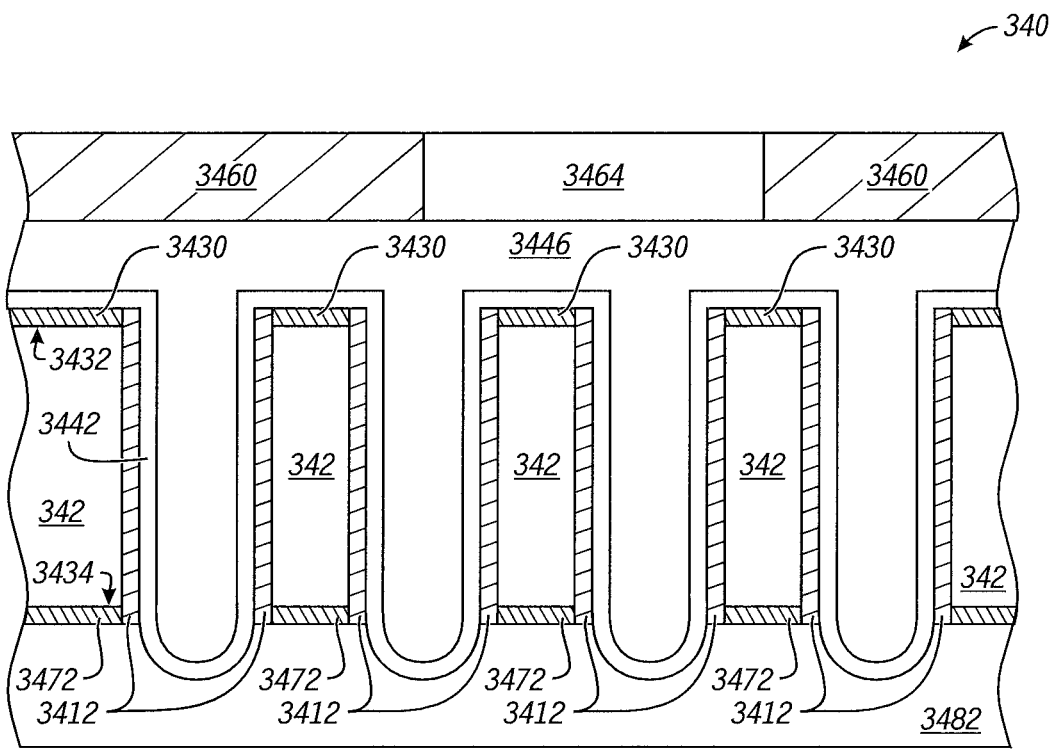
FIG. 34 includes an illustration of a cross-sectional view of a portion of a workpiece in which a diode is within the trenches.

FIG. 34 includes an illustration of a cross-sectional view of a portion of a workpiece 340 that includes a diode. As illustrated, the workpiece 340 includes a die substrate 342 having major surfaces 3432 and 3434. Portions of the substrate 342 between the trenches correspond to the features, such as any one or more of the features as previously described. An insulating layer 3430 is formed along the major surface 3432, trenches are formed within the substrate 342, and an insulating layer 3412 is formed along sidewalls of the trenches. The trenches are filled with a material, and in this embodiment, a combination of materials. A semiconductor layer 3442 having a conductivity type, and another semiconductor layer 3446 having the opposite conductivity type are sequentially formed to substantially fill the trenches. In an embodiment, the dopant concentrations of the semiconductor layers 3442 and 3446 can be chosen to achieve a desired breakdown voltage. In a particular embodiment, the diode can be a Zener diode that can be part of an electrostatic discharge or other overvoltage protection circuit to provide a dissipation current path to reduce the likelihood of damaging more sensitive electronic components within the integrated circuit. By using the depth of the trenches, less surface area of the die substrate may be used for the protection circuitry. An ILD layer 3460 is deposited and patterned to define an opening, and an interconnect 3464 is formed within the opening. The interconnect 3464 directly contacts the capacitor electrode layer 3446. The substrate 342 is thinned, an insulating layer 3472 is deposited, and portions of the insulating layer 3472 and insulating layer 3412 are removed to expose portions of the semiconductor layer 3442 along bottoms of the trenches. Metallization 3482 is formed along the side of the substrate 342 opposite from the interconnect 3464. The metallization 3384 makes direct contact with the capacitor electrode layer 3442.

Figure 35:
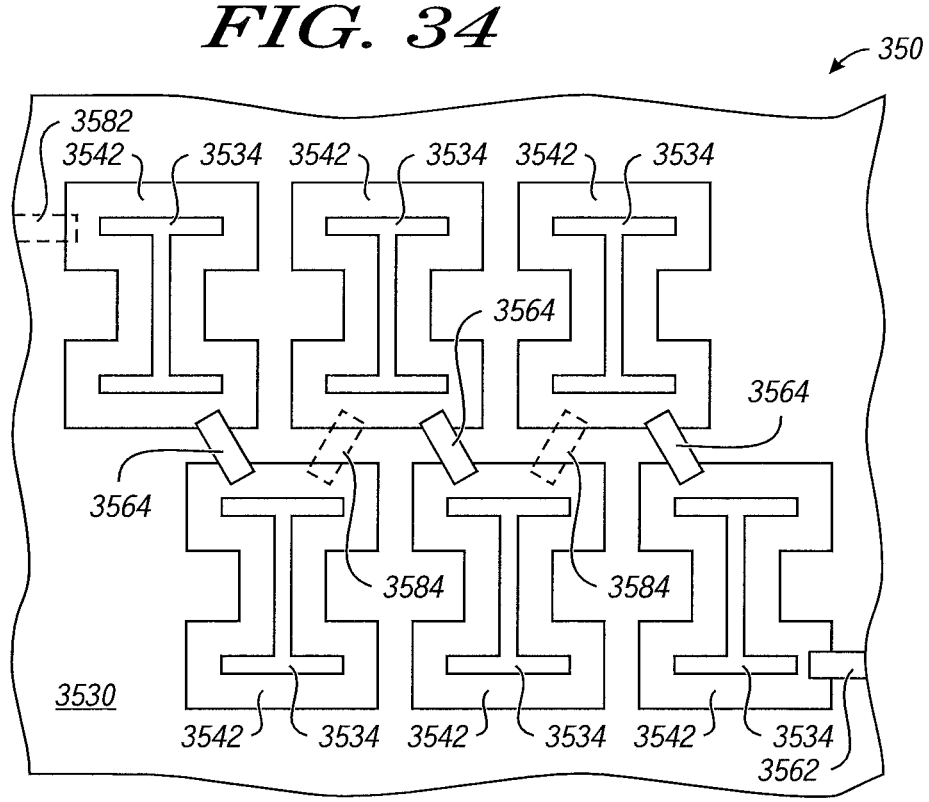
FIG. 35 includes an illustration of a top view of a portion of a workpiece in which different portions of a conductive material within different trenches are electrically connected in a particular arrangement.

FIG. 35 illustrates an embodiment in which a helical inductor is illustrated. FIG. 35 includes a top view of a workpiece 350 that is similar to the workpiece 230 in FIG. 23. The embodiment as illustrated in FIG. 35 includes features 3534 that are within trenches filled with a conductive material 3542. Interconnect 3562 is a terminal for the inductor, and interconnects 3564 provide connections between some portions of the conductive material. Because the interconnects 3562 and 3564 are visible as illustrated, they are depicted with solid lines. Interconnect 3582 is another terminal for the inductor, and interconnects 3584 provide connections between other portions of the conductive material. Because the interconnects 3582 and 3584 are along the opposite side of the die substrate (not visible as illustrated), they are depicted with dashed lines.

The embodiments described herein are used to illustrate some potential physical designs and electronic configurations that can be used. Particular physical designs and electronic configurations selected can be selected to meet the needs or desires for a particular application. Other passive electronic components and other configurations can be used without departing from the scope of the concepts described herein. In a further embodiment, the electronic components can be in the form of fusible links.

Embodiments as described herein can allow a feature to be formed with improved mechanical stability. The mechanical stability can be determined by comparing the physical layout as designed to the actual physical structure achieved at a point during fabrication. If the width of a trench is designed to be substantially uniform along the sides of a feature, and the actual widths in the physical structure are significantly different, then the feature may be considered not mechanically stable. Alternatively, the mechanical stability can be determined by comparing the dimensions after structure achieved at a point during fabrication. If the width of a trench is designed to be substantially uniform along the sides of a feature, and the actual widths in the actual physical structure are significantly nonuniform, then the feature may be considered mechanically unstable. Alternatively, mechanical stability can be determined by comparing the dimensions of the actual physical structure at different points during fabrication. If the width of a trench changes by more than 10% during a deposition or thermal operation, then the feature may be considered mechanically unstable. Alternatively, the mechanical stability can be determined if the feature becomes twisted, rotated, bent, or otherwise changes shape during a subsequent deposition or thermal operation (other a change solely caused by the oxidation of the feature itself). If the feature significantly changes shape, then the feature may be considered mechanically unstable. Thus, a feature can be considered mechanically stable if such feature is not mechanically unstable.

The feature can include a segment that significantly increases the mechanical stability of the feature within its corresponding trench. For example, see FIGS. 2 to 10. Alternatively, the feature can have an annular shape. For example, see FIGS. 11 to 13. For both sets of embodiments, the shape of the feature and the spacing between the feature and die substrate can be substantially the same before and after filling the trench. Therefore, electronic components can be formed that are more uniformly shaped, not only locally, but also across the die substrate and between different die substrates from different production lots. Such uniformity allows for better control of electronic characteristics in actual products that are closer to electronic characteristics as designed.

Embodiments as described herein can take advantage of the vertical direction (namely depth) to allow electronic components to be formed with a relatively large surface area without occupying such area along a major surface of a die substrate. For a capacitor, a relatively large capacitance can be achieved, and the capacitor may have electrical connections along a single side or opposite sides of the die substrate. Through-substrate vias can be formed as part of a die fabrication process before a substrate is thinned. Thus, through-substrate vias can be formed without detriments that may occur if through substrate vias were to be formed after the die substrate is thinned.

Many different configurations can be used so that electronic components formed within the trenches can be connected in parallel or series, and such configurations may be realized when forming interconnects and metallization for the integrated circuit. Thus, an integrated circuit that may be used in a cellular phone may have one set of connections for one particular communication standard (for example, CDMA) and a different set of connections for another particular communication standard (for example, GSM).

Flexibility exists regarding when trenches are defined, features are formed, and when the trenches are filled, which is referred to as the trench-and-fill sequence. In an embodiment, the trench-and-fill sequence may be performed early in the process flow, such as before field isolation regions are formed. In another embodiment, the trench-and-fill sequence may be performed after forming field isolation regions and before forming any permanent layers or structures over a major surface of the substrate, for example, before a gate dielectric or gate electrode layer is formed over the major surface. In still another embodiment, the trench-and-fill sequence may be performed before or as part of an interconnect level for the integrated circuit. After reading this specification, skilled artisans will appreciate that the trench-and-fill sequence can be integrated into a process flow for many different applications.

Many different aspects and embodiments are possible. Some of those aspects and embodiments are described below. After reading this specification, skilled artisans will appreciate that those aspects and embodiments are only illustrative and do not limit the scope of the present invention.

In a first aspect, an electronic device can include a die substrate defining a first trench having a depth that extends substantially completely through the die substrate, and a first feature that is disposed within the first trench and spaced apart from the die substrate, wherein the first feature can extend along at least most of the depth of the first trench. From a top view, the first feature includes a first segment and a second segment that can be substantially contiguous with the first segment, and the second segment can significantly increase a mechanical stability of the first feature, as compared to another feature having the first segment without the second segment.

In an embodiment of the first aspect, the first feature includes an I-beam. In a particular embodiment, the I-beam has a length that is approximately 1.5 to 2.5 times its width. In a more particular embodiment, the I-beam includes a pillar having a segment width (S), and the first trench has a trench width (T), and the length of the I-beam is within 20% of a value that is equal to 4S+3T. In another embodiment, from a top view, the first feature has a Y-shape. In a particular embodiment, the first feature further includes a third segment, and the first, second, and third segments have substantially a same length and width.

In a further embodiment of the first aspect, the first or second segment of the first feature has segment width (S), the first trench has a trench width (T), and T is in a range of approximately 1.0 to approximately 5.0 times S. In a particular embodiment, T is approximately 1.3 to approximately 3.0 times S. In another further embodiment, the electronic device further includes a first electronic structure within the first trench. In a particular embodiment, first electronic structure includes a passive component or a via. In other particular embodiment, the electronic device further includes a second feature and a second electronic structure, wherein the die substrate further defines a second trench spaced apart from the first trench, the second feature is disposed within the second trench and spaced apart from the first feature, the second electronic structure electrically floats, and the first electronic structure is part of a circuit.

In another embodiment of the first aspect, the electronic device further includes a second feature within the first trench, wherein the second feature is substantially equidistant from the first feature and the die substrate. In a particular embodiment, the electronic device includes an n-axial feedthrough, wherein n is a whole number that is at least 2, and the n-axial feedthrough includes the first electronic structure and the second electronic structure.

In a second aspect, an electronic device can include a die substrate defining a first trench having a depth that extends substantially completely through the die substrate. The electronic device can also include a first feature that is disposed within the first trench and spaced apart from the die substrate. The first feature can extend along at least most of the depth of the first trench. At the same elevation, the first feature and the die substrate can include substantially a same composition and crystal orientation. From a top view, the first feature can have an annular shape. In an embodiment of the second aspect, the electronic device further includes a layer that substantially fills an inner portion defined by the first feature.

In a third aspect, a process of forming an electronic device can include forming a masking layer over a first major surface of a die substrate, and etching the die substrate to define a first feature and a first trench surrounding the first feature, wherein the first trench has a depth of at least approximately 40 microns. From a top view, the first feature can include a first segment and a second segment that is substantially contiguous with the first segment, wherein the second segment can significantly increase a mechanical stability of the first feature, as compared to another feature having the first segment without the second segment. The process can also include filling substantially all of the first trench with a material.

In an embodiment of the third aspect, the process further includes thermally oxidizing the die substrate and the first feature, and in another embodiment, the process further includes depositing a dielectric material. In still another embodiment, filling substantially all of the first trench includes depositing a first polysilicon or metal-containing material.

In a further embodiment of the third aspect, the process further includes removing a portion of the die substrate along a second major surface of the die substrate to expose the material within the trench, wherein the second major surface is opposite the first major surface. In a particular embodiment, etching the die substrate also defines other features and other trenches surrounding the other features, wherein the other features are spaced apart from the first feature, and the other trenches are spaced apart from the first trench, filling substantially all of the first trench includes filling substantially all of the other trenches with the material. The process can further include removing a portion of the material to form electronic structures within the first and other trenches, and selectively electrically connecting at least some of the electronic structures together. In a more particular embodiment, after selectively electrically connecting at least some of the electronic structures together, a particular electronic structure of the electronic structure electrically floats. In still a further embodiment, the depth is at least approximately 50 microns.

Note that not all of the activities described above in the general description or the examples are required, that a portion of a specific activity may not be required, and that one or more further activities may be performed in addition to those described. Still further, the order in which activities are listed is not necessarily the order in which they are performed.

Certain features that are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device comprising: a die substrate defining an opening having a depth that extends substantially completely through the die substrate; a feature that is disposed within the opening and spaced apart from the die substrate; and an n-axial connector including a conductive material that surrounds the feature, wherein: the feature extends along at least most of the depth of the opening; and at a same elevation, the feature and the die substrate comprise substantially a same composition and crystal orientation.

2. The electronic device of claim 1, wherein from a top view, the feature includes an I-beam or a Y-shape.

3. The electronic device of claim 1, further comprising a via within the opening.

4. The electronic device of claim 1, further a passive component within the opening.

5. An electronic device comprising: a die substrate defining an opening having a depth that extends substantially completely through the die substrate; and a first feature that is disposed within the opening and spaced apart from the die substrate, wherein the first feature includes: a central segment that has a first end, a second end opposite the first end; a first segment having a first proximal end and a first distal end, wherein: the first segment is closer to the first side of the central segment than to the second side of the central segment; the first end of the central segment is closer to the first proximal end than to the first distal end; and the first distal end is spaced apart from the central segment; and a second segment having a second proximal end and a second distal end, wherein: the second segment is closer to the second side of the central segment than to the first side of the central segment; the second end of the central segment is closer to the second proximal end than to the second distal end; and the second distal end is spaced apart from the central segment.

6. The electronic device of claim 5, wherein the first feature further comprises a first connecting segment disposed between the first segment and the first side of the central segment.

7. The electronic device of claim 6, wherein at a point closest to the first side of the central segment, the first connecting segment lies between and is spaced apart from the first end of the central segment and a centerpoint of the central segment.

8. The electronic device of claim 6, wherein the first feature further comprises a second connecting segment disposed between the second segment and the second side of the central segment.

9. The electronic device of claim 5, wherein each of the first segment and the second segment is spaced apart from the central segment.

10. The electronic device of claim 5, wherein a length of the central segment is longer than each of lengths of the first segment and the second segment.

11. The electronic device of claim 5, wherein a length of the central segment is substantially parallel to lengths of the first segment and the second segment.

12. The electronic device of claim 5, further comprising other features within the opening, wherein each of the features is spaced apart from the die substrate and other features within the opening.

13. The electronic device of claim 12, wherein at least one of the other features is substantially identical to the first feature.

14. The electronic device of claim 5, further comprising a fill material disposed between the first feature and the die substrate.

15. The electronic device of claim 14, wherein the fill material includes a conductive material.

16. The electronic device of claim 14, wherein the fill material includes an insulating material.

17. The electronic device of claim 5, wherein at a same elevation, the first feature and the die substrate comprise substantially a same composition and crystal orientation.

18. The electronic device of claim 5, further comprising a via within the opening.

19. The electronic device of claim 5, further comprising a passive component within the opening.

* * * * *